US008581588B2

(12) United States Patent
Driesel et al.

(10) Patent No.: US 8,581,588 B2
(45) Date of Patent: Nov. 12, 2013

(54) STRIPLINE ANTENNA AND ANTENNA ARRAY FOR A MAGNETIC RESONANCE DEVICE

(75) Inventors: Wolfgang Driesel, Sandersdorf (DE); Harald Moeller, Leipzig (DE)

(73) Assignee: Max-Planck-Gesellschaft zur Foerderung der Wissenschaften E.V. (DE)

( * ) Notice: Subject to any disclaimer, the term of this patent is extended or adjusted under 35 U.S.C. 154(b) by 434 days.

(21) Appl. No.: 12/678,638

(22) PCT Filed: Sep. 19, 2008

(86) PCT No.: PCT/EP2008/007899
§ 371 (c)(1),
(2), (4) Date: Mar. 17, 2010

(87) PCT Pub. No.: WO2009/043491
PCT Pub. Date: Apr. 9, 2009

(65) Prior Publication Data
US 2010/0213941 A1 Aug. 26, 2010

(30) Foreign Application Priority Data

Sep. 28, 2007 (EP) .................................... 07019151

(51) Int. Cl.
*G01V 3/00* (2006.01)
*G01R 33/48* (2006.01)
(52) U.S. Cl.
USPC ............ 324/322; 324/307; 324/309; 324/318
(58) Field of Classification Search
USPC ........................... 324/300–322; 600/407–464
See application file for complete search history.

(56) References Cited

U.S. PATENT DOCUMENTS 4,620,155 A * 10/1986 Edelstein ...................... 324/322
4,825,162 A 4/1989 Roemer et al.
(Continued)

FOREIGN PATENT DOCUMENTS

DE    102004006322 A1    11/2005
DE    202007015620 U1    3/2008
(Continued)

OTHER PUBLICATIONS

Wiggins et al., "32-channel 3 Tesla receive-only phased array head coil with soccer-ball element geometry", Magnetic Resonance in Medicine, vol. 56, pp. 216-223 (2006).

(Continued)

*Primary Examiner* — Melissa Koval
*Assistant Examiner* — Emily Chan
(74) *Attorney, Agent, or Firm* — Caesar, Rivise, Bernstein, Cohen & Pokotilow, Ltd.

(57) ABSTRACT

An antenna (100) for a magnetic resonance device has a predetermined sensitivity and is designed to excite and/or detect a magnetic resonance in an object under test. The antenna (100) includes a stripline resonator (10) that is equipped with at least one stripline (11), and a conductor loop arrangement (20) that adjoins the stripline resonator (10) and forms at least one conductor loop (21, 22, 28) which is interrupted by at least one capacitor (23). The sensitivity of the antenna (100) is formed by overlapping sensitivity profiles of the stripline resonator (10) and the conductor loop arrangement (20). Also described are an antenna array (200) including a plurality of antennas (100), a magnetic resonance device (300) including at least one antenna (100) or antenna array (200), and methods for magnetic resonance imaging or magnetic resonance spectroscopy.

25 Claims, 18 Drawing Sheets

(56) References Cited

U.S. PATENT DOCUMENTS

| | | | |
|---|---|---|---|
| 5,804,969 | A | 9/1998 | Lian et al. |
| 6,023,166 | A * | 2/2000 | Eydelman ............... 324/318 |
| 6,771,070 | B2 * | 8/2004 | Lee .......................... 324/318 |
| 6,771,071 | B1 | 8/2004 | Wright et al. |
| 7,268,554 | B2 * | 9/2007 | Vaughan ................. 324/322 |
| 7,417,431 | B2 | 8/2008 | Lanz et al. |
| 7,427,861 | B2 * | 9/2008 | Bogdanov et al. ...... 324/318 |
| 7,994,788 | B2 * | 8/2011 | Hardy et al. ............ 324/318 |
| 8,154,469 | B2 * | 4/2012 | McKinley et al. ...... 343/850 |
| 2002/0079996 | A1 | 6/2002 | Zhang et al. |
| 2002/0145428 | A1 * | 10/2002 | Nistler et al. ........... 324/318 |
| 2002/0180439 | A1 | 12/2002 | Lee |
| 2003/0214299 | A1 | 11/2003 | Lee et al. |
| 2004/0066195 | A1 * | 4/2004 | Reykowski .............. 324/319 |
| 2005/0024054 | A1 | 2/2005 | Rinneberg et al. |
| 2005/0062472 | A1 | 3/2005 | Bottomley |
| 2005/0109010 | A1 | 5/2005 | Dean et al. |
| 2005/0162168 | A1 | 7/2005 | Ludwig et al. |
| 2007/0080768 | A1 | 4/2007 | Lee |
| 2007/0152668 | A1 | 7/2007 | Zhang |
| 2009/0096553 | A1 | 4/2009 | Driesel et al. |
| 2011/0050225 | A1 * | 3/2011 | Prisner et al. .......... 324/307 |

FOREIGN PATENT DOCUMENTS

| | | | |
|---|---|---|---|
| EP | 1624314 | A1 | 2/2006 |
| WO | 0231522 | A1 | 4/2002 |
| WO | 03058283 | A1 | 7/2003 |
| WO | 2005076029 | A1 | 8/2005 |
| WO | 2005111645 | A2 | 11/2005 |
| WO | 2006113545 | A2 | 10/2006 |

OTHER PUBLICATIONS

Wright et al., "Resolution enhancement in single echo acquisition (SEA) MR imaging", Proc. Intl. Soc. Mag. Reson. Med. 11, p. 2338 (2003).

Wright et al., "Single echo acquisition (SEA) MR imaging", Proc. Intl. Soc. Mag. Reson. Med. 11, p. 23 (2003).

Wright et al., "Theory and application of array coils in MR spectroscopy", NMR in Biomedicine, vol. 10, pp. 394-410 (1997).

Yallapragada et al., "Adjustable simultaneous inductive decoupling of large arrays", Proc. Intl. Soc. Mag. Reson. Med. 14, p. 2571 (2006).

Zhang et al., "Design of high frequency volume coil using MTL resonators: a simple solution to the RF volume coil design at ultrahigh magnetic fields", Proc. 12th Annual Meeting of the International Society for Magnetic Resonance in Medicine, Kyoto, p. 1547 (2004).

Zhang et al., "Microstrip RF surface coil design for extremely high-field MRI and spectroscopy", Magnetic Resonance in Medicine, vol. 46, pp. 443-450 (2001).

Zhang et al., "A microstrip transmission line volume coil for human head MR imaging at 4 T", Journal of Magnetic Resonance 161, pp. 242-251 (2003).

Zhu et al., "Highly parallel volumetric imaging with a 32-element RF coil array", Magnetic Resonance in Medicine, vol. 52, pp. 869-877 (2004).

Adriany et al., "Transceive stripline arrays for ultra high field parallel imaging applications", Proc. 11th Annual Meeting of the International Society for Magnetic Resonance in Medicine, Toronto, p. 474 (2003).

Adriany et al., "A 32 channel transmit/receive transmission line head array for 3D RF shimming", Proc. Intl. Soc. Mag. Reson. Med. 15, p. 166 (2007).

Alagappan et al., "An 8 channel transmit coil for transmit sense at 3T", Proc. Intl. Soc. Mag. Reson. Med. 14, p. 121 (2006).

Bahl et al., "A designer's guide to microstrip line", Microwaves, pp. 174-179 (1997).

Bankson et al., "SMASH imaging with an eight element multiplexed RF coil array", Magn. Reson. Mater. Phys. Biol. Med., vol. 10, pp. 93-104 (2000).

Chan et al., "Diagonal-arranged quadrature coil arrays for 3D SENSE imaging", Proc. 11th Annual Meeting of the International Society for Magnetic Resonance in Medicine, Kyoto, p. 2382 (2004).

Choi et. al., "Simple partial volume transceive coils for in vivo 1H MR studies at high magnetic fields", Concepts in Magnetic Resonance Part B (Magnetic Resonance Engineering), vol. 31B(2), pp. 71-85 (2007).

De Zwart et al., "Design of a SENSE-optimized high-sensitivity MRI receive coil for brain imaging", Magn. Reson. Med., vol. 47(6), pp. 1218-1227 (2002).

De Zwart et al., "Signal-to-noise ratio and parallel imaging performance of a 16-channel receive-only brain coil array at 3.0 Tesla", Magn. Reson. Med., vol. 51(1), pp. 22-26 (2004).

Driesel et al., "A new helmet coil concept using strip lines", Proc. 13th Annual Meeting of the International Society for Magnetic Resonance in Medicine, Miami Beach, p. 948 (2005).

Driesel et. al., "Reengineered helmet coil for human brain studies at 3 Tesla", Concepts in Magnetic Resonance Part B (Magnetic Resonance Engineering), vol. 27B(1), pp. 64-74 (2005).

Fujita et al., "A novel 8-channel "Saddle-Train" array coil for abdominal SENSE imaging at 1.5 T", Proc. Intl. Soc. Mag. Reson. Med. 10 (2002).

Fujita et al., "A novel 8-channel "Saddle-Train" array coil for cardiac SENSE imaging at 1.5 T", Proc. Intl. Soc. Mag. Reson. Med. 10 (2002).

Gotshal et al., "The linear EIGENCOIL", Proc. Intl. Soc. Mag. Reson. Med. 11 (2004).

Graesslin et al., "Fully integrated whole body 3T MRI system for parallel RF transmission", Proc. Intl. Soc. Mag. Reson. Med. 15, p. 1007 (2007).

Graesslin et al., "Whole body 3T MRI system with eight parallel RF transmission channels", Proc. Intl. Soc. Mag. Reson. Med. 14, p. 129 (2006).

Griswold et al., "Partially parallel imaging with localized sensitivities (PILS) Magnetic Resonance in Medicine", vol. 44, pp. 602-609 (2000).

Hajnal et al., "An array that exploits phase for SENSE imaging", Proc. 8th Annual Meeting of the International Society for Magnetic Resonance in Medicine, Denver, CO, p. 1719 (2000).

Hardy et al., "Large field-of-view real-time MRI with a 32-channel system", Magn. Reson. Med., vol. 52, pp. 878-884 (2004).

Itoh, "Overview of quasi-planar transmission lines", IEEE Trans. Microwave Theory Techniques, vol. 37, pp. 275-280 (1989).

Jevtic, "Ladder networks for capacitive decoupling in phased-array coils", Proc. 9th Annual Meeting of the International Society for Magnetic Resonance in Medicine, Glasgow, p. 17 (2001).

Jevtic et al., "Design guidelines for the capacitive decoupling networks", Proc. 11th Annual Meeting of the International Society for Magnetic Resonance in Medicine, Toronto, p. 428 (2003).

Jones et al., "Quadrature strip-line surface coil for ultra-high field imaging (7T)" Proceedings of the International Society for Magnetic Resonance in Medicine, Joint Annual Meeting ISMRM-ESMRMB, p. 1065, XP002470651 (2007).

Katscher et al., "Transmit SENSE", Magnetic Resonance in Medicine, vol. 49, pp. 144-150 (2003).

King et al., "The MRI eigencoil: 2N-channel SNR with N-receivers", Proc. Intl. Soc. Mag. Reson. Med. 11, p. 712 (2003).

Lee et al., "Coupling and decoupling theory and its application to the MRI phased array" Magn. Reson. Med., vol. 48 (1), pp. 203-213 (2002).

Lee et al., "Lumped-element planar strip array (LPSA) for parallel MRI", Magn. Reson. Med., vol. 51(1), pp. 172-183 (2001).

Lee et al., "Planar strip array (PSA) for MRI", Magn. Reson. Med., vol. 45(4), pp. 673-683 (2001).

Lee et al., "Planar strip array antenna for parallel spatial encoded MRI", Proc. 8th Annual Meeting of the International Society for Magnetic Resonance in Medicine, Denver, p. 558 (2000).

Lin et al., "Degenerate mode birdcage volume coil for sensitivity-encoded imaging", Magn. Reson. Med., vol. 50(5), pp. 1107-1111 (2003).

McDougall et al., "A 64 channel planar RF coil array for parallel imaging at 4.7 Tesla", Proc. 11th Annual Meeting of the International Society for Magnetic Resonance in Medicine, Toronto, p. 472 (2003).

(56) References Cited

OTHER PUBLICATIONS

Mueller et al., "Design considerations for volumetric arrays with many elements for massively parallel MRI", Proc. 11th Annual Meeting of the International Society for Magnetic Resonance in Medicine, Toronto, p. 2340 (2003).

Mueller et al., "8 channel double spiral head array coil for enhanced 3D parallel MRI at 1.5T", Proc. Intl. Soc. Mag. Reson. Med 11 (2004).

Ohliger et al., "Ultimate intrinsic signal-to-noise ratio for parallel MRI: Electromagnetic field considerations", Magnetic Resonance in Medicine, vol. 50, pp. 1018-1030 (2003).

Ohliger et al., "Concentric coil arrays for spatial encoding in parallel MRI", Proc. Intl. Soc. Mag. Reson. Med. 9, p. 21 (2001).

Ohliger et al., "Concentric coil array with multidimensional symmetry for parallel MRI of the heart", Proc. Intl. Soc. Mag. Reson. Med. 11 (2004).

Pruessmann et al., "SENSE: Sensitivity encoding for fast MRI", Magn. Reson. Med. vol. 42(5), pp. 952-962 (1999).

Roemer et al., "The NMR phased array", Magn. Reson. Med., vol. 16(2), pp. 192-225 (1990).

Schnieder et al., "Model of thin-film microstrip line for circuit design", IEEE Trans. Microwave Theory Techniques, vol. 49, pp. 104-110 (1999).

Seeber et al., "New RF coil topology for high performance SENSE in 3D", Proc. 11th Annual Meeting of the International Society for Magnetic Resonance in Medicine, Toronto, p. 465 (2003).

Silva et al., "Hardware considerations for functional magnetic resonance imaging", Concepts Magn. Reson. Part A, vol. 16A, pp. 35-49 (2002).

Sodickson et al., "Simultaneous acquisition of spatial harmonics (SMASH): fast imaging with radiofrequency coil arrays", Magn. Reson. Med., vol. 38(4), pp. 591-603 (1997).

Sodickson, "Spatial encoding using multiple RF coils: SMASH imaging and parallel MRI," in Methods in Biomedical Magnetic Resonance Imaging and Spectroscopy, edited by IR Young (Wiley, Chichester, 2000), pp. 239-250.

Song et al., "Digitalization decoupling method and its application to the phased array in MRI", Prog. Nat. Sci., vol. 13 (9), pp. 683-689 (2003).

Spence et al., "A new coil array for sense imaging with four or eight receivers", Proc. Intl. Soc. Mag Reson. Med 10 (2002).

Varosi et al., "A hardware combiner to achieve "optimal" SNR using sum-of-squares reconstruction", Proc. Intl. Soc. Mag. Reson. Med. 10 (2002).

Vaughan et al., "Detunable transverse electromagnetic (TEM) volume coil for high-field NMR", Magnetic Resonance in Medicine, vol. 47, pp. 990-1000, XP002470652 (2002).

Wiggins et al., "A 32 channel receive-only head coil and detunable transmit birdcage coil for 7 Tesla brain imaging", Proc. Intl. Soc. Mag. Reson. Med. 14, p. 415 (2006).

Wiggins et al., "Design optimization and SNR performance of 3T 96 channel phased array head coils", Proc. Intl. Soc. Mag. Reson. Med. 15, p. 243 (2007).

Wiggins et al., "B1 transmit field manipulation at 7 Tesla using controlled decoupling of array coil elements (CODACE)", Proc. Intl. Soc. Mag. Reson. Med. 15, p. 1054 (2007).

\* cited by examiner (A)

(B)

(A)

(B)

(A)

(B)

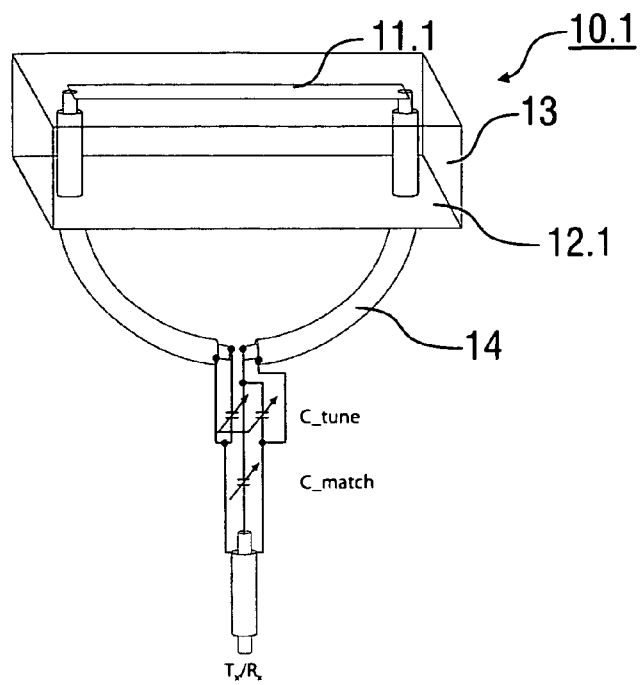
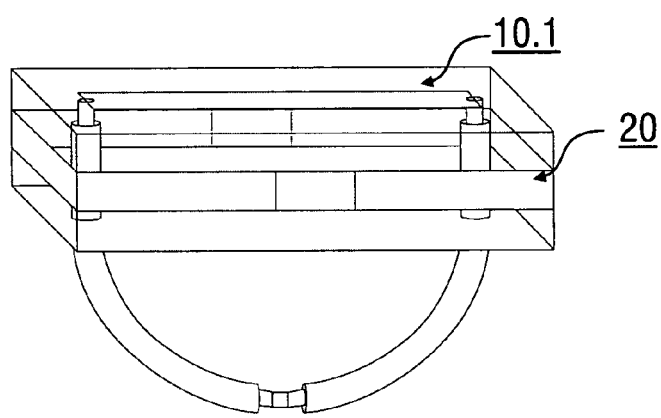
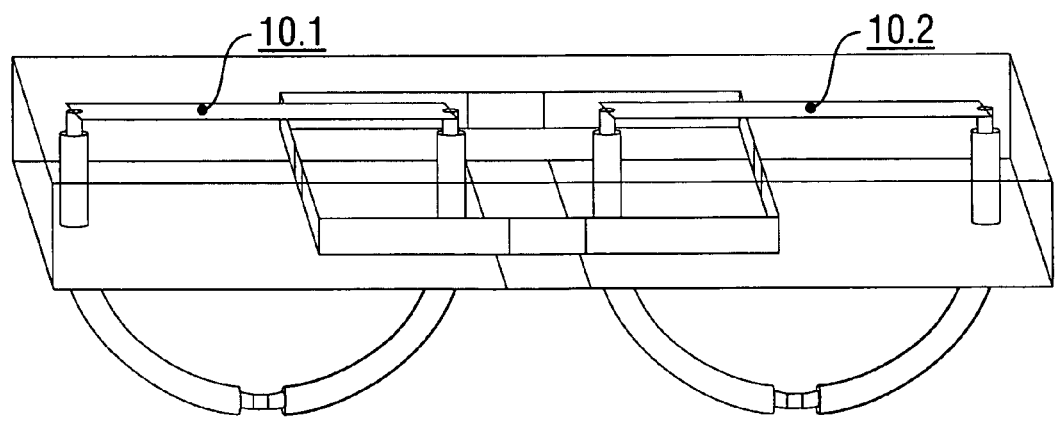
FIG. 17 (A – C)

(D – F)

STRIPLINE ANTENNA AND ANTENNA ARRAY FOR A MAGNETIC RESONANCE DEVICE

SUBJECT MATTER OF THE INVENTION

The invention relates to an antenna for a magnetic resonance device (MR-device). The invention also relates to an antenna array for an MR-device and to a method of operating the MR-device. The main application of the invention is for magnetic resonance imaging (MRI) and for magnetic resonance spectroscopy.

PRIOR ART

Magnetic nuclear resonance has become established as an important imaging and analysis method, in particular in medicine. This method makes use of the fact that magnetic nuclear moments in the static magnetic field can be deflected when electromagnetic energy of a defined frequency is radiated. The frequency is determined from the strength of the static magnetic field and the gyromagnetic constant of the atom nuclei examined. The nuclear moments which precede coherently as a result of the excitation generate a magnetic induction signal which can be registered by suitable coils and can be used for the reconstruction of an image. Basically, the same coils can be used both for excitation, i.e. transmitting a high-frequency (HF) signal, and for reception. Since the signal of coils in the near field becomes stronger and more inhomogeneous the closer the distance to the conductor of the HF-coil, so-called volume coils have often been used initially to radiate HF energy relatively homogenously into the volume to be examined and small surface coils have been used for reception purposes. In comparison with the reception by volume coils, the signal-to-noise ratio (SNR) can be increased significantly. However, the field of view (FOV) also becomes greatly restricted.

Since about 1990, antenna arrays which are composed of several individual coils (referred to hereinafter as antennas) have been used in order to increase the SNR in the coil-near regions (see e.g. Roemer P B, Edelstein W A. Nuclear magnetic resonance (NMR) imaging with multiple surface coils. U.S. Pat. No. 4,825,162 1; Roemer P B, Edelstein W A, Hayes C E, Souza S P, Mueller O M. The NMR phased array. Magn. Reson. Med. 1990; 16(2): 192-225; Lian J, Roemer P B. MRI RF coil. U.S. Pat. No. 5,804,969). The first arrays consisted of several antennas which were disposed mostly in a planar and partially overlapped manner. By virtue of the partial overlapping of the adjacent antennas it was possible to minimize the inductive coupling between these antennas. Since this principle of decoupling is only applicable to adjacent antennas, the principle of preamplifier decoupling was additionally used in the reception to minimize the coupling between the array elements.

In the time since then, arrays were optimized for different applications. They differed in particular according to the geometric arrangement of the antennas. Thus, arrays are known, in which the partial coils are disposed along a line (see e.g. Bankson J A, Griswold M A, Wright S M, Sodickson D K. SMASH imaging with an eight element multiplexed RF coil array. Magn. Reson. Mater. Phys. Biol. Med. 2000; 10: 93-10) or disposed in a grid-like manner in one face (see e.g. Hardy C J, Darrow R D, Saranathan M, Giaquinto R, Zhu Y, Dumoulin C L, Bottomley P A. Large field-of-view real-time MRI with a 32-channel system. Magn. Reson. Med. 2004; 52: 878-884). In order to better adapt the arrays to the shape of objects being examined, arrangements were also developed on the outer surface of a cylinder (see e.g. de Zwart J A, Ledden P J, Kellman P, van Gelderen P, Duyn J H. Design of a SENSE-optimized high-sensitivity MRI receive coil for brain imaging. Magn. Reson. Med. 2002; 47(6): 1218-1227; de Zwart J A, Ledden P J, van Gelderen P, Bodurka J, Chu R X, Duyn J H. Signal-to-noise ratio and parallel imaging performance of a 16-channel receive-only brain coil array at 3.0 Tesla. Magn. Reson. Med. 2004; 51(1): 22-26).

In the case of the "classic" array design, magnetic field gradients are used exclusively for the encoding of spatial information and the improvement in SNR in the FOV is at the forefront. After the initial work aimed at achieving parallel imaging (see e.g. Pruessmann K P, Weiger M, Scheidegger M B, Boesiger P. SENSE: Sensitivity encoding for fast MRI. Magn. Reson. Med. 1999; 42(5): 952-962; Sodickson D K, Manning W J. Simultaneous acquisition of spatial harmonics (SMASH): fast imaging with radiofrequency coil arrays. Magn. Reson. Med. 1997; 38(4): 591-603) new arrays were developed which are adapted to parallel imaging. Array antennas for parallel imaging are disposed in such a manner that their sensitivity variation is strongly pronounced in an "undersampling" direction.

From the point of view of parallel image reconstruction in the k-space (e.g. GRAPPA-method) the antenna elements should be aligned in such a manner that the missing raw data lines can be reconstructed. From the point of view of parallel image reconstruction in the local space (e.g. SENSE-method) the partial antennas should be disposed in such a manner that any overlaps can be subsequently reversed arithmetically. Linear arrays provide maximum spatial information in one direction, whereas array elements which are disposed in a grid-like manner (and can also be disposed on curved surfaces) provide spatial information from several directions. It has also be found that simultaneous "undersampling" in several directions results in a smaller geometry factor g.

The sensitivity of the partial antennas is a complex function of the position and is incorporated into the reconstruction algorithm. Therefore, in addition to the amplitude the phase of the signal received in an array element also represents an important source of information for spatial encoding. As an example, it is thus possible to consider antennas in the form of a figure "8" in combination with simple circular coils as independent antennas in terms of parallel imaging (see e.g. Hajnal J V, Larkman D J, Herlihy D J. An array that exploits phase for SENSE imaging. Proc. 8th Annual Meeting of the International Society for Magnetic Resonance in Medicine, Denver, Colo., 2000; 171).

Particularly in the case of grid-like arrays, g-factors which were improved in comparison with an overlapping arrangement were found in an array with a spaced interval ("gap") between the antennas. WO 2005/109010 describes the development of the arrangement of overlapping antennas on curved surfaces. In addition to the grid-like arrays, concentric arrangements of array elements (see e.g. Chan P H, Michael K, Anderson B. Diagonal-arranged quadrature coil arrays for 3D SENSE imaging. Proc. 12th Annual Meeting of the International Society for Magnetic Resonance in Medicine, Kyoto, 2004; 2382), arrays having triangular coil sections (see e.g. Seeber D A, Pikelja V, Jevtic I. New RF coil topology for high performance SENSE in 3D. Proc. IIth Annual Meeting of the International Society for Magnetic Resonance in Medicine, Toronto, 2003; 465), arrays having twisted coils (see e.g. Mueller M F, Griswold M A, Haase A, Jakob P M. Design considerations for volumetric arrays with many elements for massively parallel MRI. Proc. 11th Annual Meeting of the International Society for Magnetic Resonance in Medicine, Toronto, 2003; 2340) or even arrays based upon volume coils (see e.g. Lin F H, Kwong K K, Huang I J, Belliveau J W, Wald L L. Degenerate mode birdcage volume coil for sensitivity-encoded imaging. Magn. Reson. Med. 2003; 50(5): 1107-1111) have also been described in the literature. In general, it can be stated that the SNR becomes better the greater the packing density of the used coils per unit of area. It thereby becomes possible to increase the image resolution. What is also to be seen as a crucial advantage is the ability to use methods for parallel imaging which permit substantially shorter image acquisition times to the point of real time registration.

In the case of the conventional array antennas, the coupling between the individual partial antennas plays a significant role, as it can lead to a deterioration of the tuning behavior, a deterioration of the SNR and to reconstruction errors. In addition to the aforementioned methods of overlapping the coils and of preamplifier decoupling, complex capacitive or inductive decoupling networks are used (see e.g. Jevtic J. Ladder networks for capacitive decoupling in phased-array coils. Proc. 9th Annual Meeting of the International Society for Magnetic Resonance in Medicine, Glasgow, 2001; 17; Lee R F, Giaquinto R O, Hardy C J. Coupling and decoupling theory and its application to the MRI phased array. Magn. Reson. Med. 2002; 48(1): 203-213; Jevtic J, Pikelja V, Menon A, Seeber D, Tatum N. Design guidelines for the capacitive decoupling networks. Proc. $11^{th}$ Annual Meeting of the International Society for Magnetic Resonance in Medicine, Toronto, 2003; 428). However, the data can also be corrected accordingly at a later stage (see Song X Y, Wang W D, Zhang B D, Lei M, Bao S L. Digitalization decoupling method and its application to the phased array in MRI. Prog. Nat. Sci. 2003; 13(9): 683-689) or the influence of the coupling can be reduced by combining the partial antennas with a so-called "hardware combiner", so as to produce an alternative basic set with disappearing noise correlation between the partial antennas. The literature also discloses various methods of shielding between the partial antennas. The imaging device for use of the MR as described in WO 2005/076029 A1 effects extensive shielding in the coil plane and does not influence transmission and reception.

The above-described arrays based upon coils have the general disadvantage that a large amount of outlay is required to produce the arrays having a relatively large number of partial antennas. Their construction is very complicated particularly in the case of a high coil packing density. The calibration of the coils is also frequently very difficult. Specifically in the case of relatively high MR-frequencies, in which the antenna dimensions are in the order of magnitude of the wavelength, it becomes impossible to adjust antennas on the basis of coils. The complicated production (including calibration) and the limited packing density encourage interest in alternative solutions.

A considerable simplification in the construction of an array offers antennas based upon strip line technology (see e.g. WO 03/058283; WO 02/31522; Lee R F, Hardy C J, Sodickson D K, Bottomley P A. Lumped element planar strip array (LPSA) for parallel MRI. Magn. Reson. Med. 2004; 51(1): 172-183; US 2002/0079996; Ugurbil K, Chen W, Adriany G, Van de Moortele P, Wiesinger F, Andersen P, Strupp J, Zhang X, Snyder C J, Chen W, Pruessmann K, Boesiger P, Vaughan J T, Ugurbil K. Transcieve stripline arrays for ultra high field parallel imaging applications. Proc. $11^{th}$ Annual Meeting of the International Society for Magnetic Resonance in Medicine, Toronto, 2003; 474). In particular, it is possible to produce arrays consisting of strip line antennas which in the case of suitable geometric dimensioning are intrinsically decoupled (Lee R F, Westgate C R, Weiss R G, Newman D C, Bottomley P A. Planar strip array (PSA) for MRI. Magn. Reson. Med. 2001; 45(4): 673-683). Strip line antennas can also be used for the purposes of local transmission, in order to achieve a reduction in the specific absorption rate (SAR) or even a homogenization of the excitation particularly also in the case of relatively high field strengths.

In the case of planar strip line arrays, the sensitivity profile perpendicular to the strip lines is virtually sinusoidal (Lee R F, Westgate C R, Weiss R G, Bottomley P A. Planar strip array antenna for parallel spatial encoded MRI. Proc. 8th Annual Meeting of the International Society for Magnetic Resonance in Medicine; Denver, 2000; 558), which creates ideal conditions for parallel imaging. On the basis of these considerations, an array having 64 partial antennas over about 100 cm$^2$ has already been produced (McDougall M P, Wright S M, Brown D G. A 64 Channel RF coil array for parallel imaging at 4.7 Tesla. Proc. $11^{th}$ Annual Meeting of the International Society for Magnetic Resonance in Medicine, Toronto, 2003; 472), wherein image acquisition can be effected in about 30 ms. Driesel et al. (Proc. 13th Annual Meeting of the International Society for Magnetic Resonance in Medicine, Miami Beach, 2005; 948) exploit the intensity distribution of strip line resonators in the conductor direction and optimized the field profile within a helmet coil with the inclusion of geometric considerations.

However, in comparison with coils, strip line antennas are faced with the drawbacks of lower penetration depth and weakly pronounced sensitivity variation in the direction of the strip lines, which in particular prevents or at the very least greatly impedes accelerated image acquisition in the direction of the strip lines.

Although resonators which are constructed from strip lines can be optimized to a certain extent in terms of penetration depth, e.g. by increasing the thickness of the dielectric, these endeavors are subject to limits, since in the case of higher substrate thicknesses these arrangements can no longer be operated in the quasi-TEM-mode (Lee R F, Hardy C J, Sodickson D K, Bottomley P A. Lumped-element planar strip array (LPSA) for parallel MRI. Magn. Reson. Med. 2004; 51: 172-183).

The literature discloses ways of influencing the field profile of strip line resonators. However, these control options disclosed therein are of a "static" nature, i.e. they cannot simply be modified during the experiment. The first group includes changes in the dielectric constant of the dielectric for the construction of the strip lines and changes in the geometry of the antenna array, whereas the second group includes mainly measures for sequentially changing terminations by means of rapid switching diodes. Thus, although by displacing the sinusoidal intensity distribution in the direction of the strip lines, it is possible in combination with geometric measures to optimize the geometric characteristics of the intensity profile, in terms of the requirements of the sensitivity profile in the direction of the strip lines for accelerated image acquisition, optimum values are not achieved by these measures.

WO 2005/111645 A2 describes a resonator, in which two orthogonal coil systems having one or several conductive outer shields are used. Without any additional measures, these shields inevitably cause coupling between the coils and the formation of oscillation modes according to the principle of a birdcage antenna (cf. in this respect Zhang X, Chen W. Design of high frequency volume coil using MTL resonators: a simple solution to the RF volume coil design at ultrahigh magnetic fields. in Proc. 12th Annual Meeting of the International Society for Magnetic Resonance in Medicine, Kyoto, 2004; 1547). A variation is also described, in which a conductor loop and the strip line are stacked in the manner of a sandwich. In the overlapping areas, capacitances having a detrimental effect (in particular an increase in the capacitive coupling between the individual antennas) are inevitably formed between the individual conductors. The elements can no longer be controlled independently of each other. The antenna array described in US 2005/0162168 A1 is a helmet coil which is constructed exclusively from conductor loop elements (cf. e.g. Silva A C, Merkle H. Hardware considerations for functional magnetic resonance imaging. Concepts Magn. Reson. Part A 2002; 16A: 35-49). The conductor loop elements comprise annular conductors and straps which produce fields located orthogonal to each other. In the case of the technology described in US 2007/0080768 A1 at least two coils are used, wherein the planes of the strip line and conductor loop elements are disposed orthogonal to each other. The conductor loop elements serve to generate an alternating magnetic field $B_1$ in the direction of the strip lines. WO 2006/113545 A2 describes a conductor network which consists of capacitors and/or coils and in addition to decoupling directly adjacent coils also decouples coils which are located more remotely. The antenna described in US 2005/0024054 A1 consists of a conductor which is bent in the shape of a strip around a cuboidal insulating body and which is capacitively bridged at one location for adjusting purposes. This antenna generates a magnetic field which extends substantially in parallel with the surface of the surface conductor. However, the sheet antenna proposed in US 2005/0024054 A1 in conjunction with the annular conductor proposed therein is not suitable without additional measures for use in the production of arrays owing to the strong coupling.

OBJECTIVE OF THE INVENTION

The objective of the invention is to provide an improved antenna which serves to obviate the disadvantages of the conventional antennas. In particular, the objective of the invention is to provide a variable antenna for an MR-device which permits improved structuring of the antenna sensitivity and/or a high coil packing density. Furthermore, the objective of the invention is to provide an improved antenna arrangement (antenna array) which serves to obviate the disadvantages of the conventional antenna arrays. It is also the objective of the invention to provide an improved method of operating the antennas or antenna arrays. In particular, the method is also intended to be suitable for controlling the antennas or antenna arrays and for increasing the spatial and/or temporal resolution capability of MR-methods.

These objectives are achieved by an antenna, an antenna array, an MR-device and methods of the invention.

SUMMARY OF THE INVENTION

In accordance with a first aspect, the said objective of the invention is achieved by the general technical teaching of providing an antenna for an MR-device which is arranged for exciting and/or detecting a magnetic resonance in an object to be examined and comprises at least one strip line resonator having at least one strip line and at least one conductor loop arrangement having at least one conductor loop which is interrupted by at least one capacitor. The at least one conductor loop arrangement is disposed in an immediate surrounding of the strip line resonator, so that the sensitivity of the antenna is formed by superimposed sensitivity profiles of the at least one strip line resonator and the at least one conductor loop arrangement. The conductor loop arrangement can be used to influence or control the sensitivity of the antenna, so that the conductor loop arrangement can also be designated as a control device or conductor loop resonator.

The conductor loop arrangement has at least one conductor loop, whose conductor is interrupted preferably by means of the at least one capacitor. The conductor is formed preferably in a layered manner. In order to form a layered or stratified form, the conductor thus preferably has a two-dimensional, in particular planar main expansion and a thickness which is substantially less than the length and width of the conductor. Layered conductors can have advantages in relation to the formation of the field profile, the reduction of the capacitive coupling and the production of the antenna. However, conductors having different cross-sectional forms, e.g. wire conductors having a circular cross-section, can be provided as an alternative, in particular in dependence upon the specific application of the invention.

In the case of the antenna in accordance with the invention, fields at least having a vector component in a plane perpendicular to the strip line resonator can be generated or received. For this purpose, it is preferably provided that the at least one conductor loop is not aligned in parallel relative to the strip line, i.e. that the plane of the layered conductor of the conductor loop is not parallel, i.e. is inclined, relative to a reference plane, in which the strip line resonator extends. If in accordance with a preferred variation of the invention the field generated by the conductor loop arrangement is aligned orthogonally relative to the field generated by the strip line resonator, advantages are achieved in terms of the decoupling between the conductor loop arrangement and the strip line resonator. It can also be advantageous to operate mutually orthogonal strip line resonators in combination with their conductor loop arrangements in quadrature. This leads to a reduction in the required transmission power and to an improved SNR during reception. These advantages are based in particular upon the finding that in the case of coils operated in quadrature the required transmission power is halved, and that in the reception the SNR is increased by a factor of 1.4

An important advantage of the variable antenna in accordance with the invention is that with respect to conventional antennas on a waveguide-(strip line) basis it is characterized in particular by a high coil density and significant variation of the sensitivity profile in all three spatial directions and control options within broad limits. In an advantageous manner, the optimum conditions for parallel imaging perpendicular to the strip lines are expanded to all three spatial directions with the antenna by means of the conductor loop arrangement. The spatial and/or temporal resolution in the MR-experiment can be improved. In addition, improvements for HF-shimming or for parallel transmission techniques are achieved. Further advantages of the antenna can be seen in the fact that it can be produced in a convenient and cost-effective manner.

In contrast to the restricted control options of conventional antennas, the conductor loop arrangement in accordance with the invention permits, in particular in the direction of the strip lines of the strip line resonator, locally effective interventions into the sensitivity profile of the antenna which range from the cancellation in limited regions to a significant increase. Therefore, the sensitivity profile of the antenna in this direction deviates markedly from the status without the conductor loop arrangement, and an excitation in accordance with various sensitivity profiles in combination with several HF-transmitters or suitably processed transmission signals can be effected in parallel in the object being examined. Therefore, additional degrees of freedom for selective spatial excitation of 3-dimensional objects are achieved. An optimum antenna array in particular in terms of 3D-acceleration is thus achieved by the antenna which is proposed in accordance with the invention.

The inventors have been able to demonstrate that the formation of disruptive capacitances between the conductor tracks can be minimized, in that the conductor loops are designed in a 2-dimensional manner and are disposed perpendicular to the strip line, so that the strip line is preferably surrounded substantially from the outside. If the strip line resonator extends generally along a planar or curved reference surface, then the at least one conductor loop surrounds the strip line resonator along an outer edge of the reference surface. The overlapping surface is significantly reduced, as it is not the width of the film (guide value several mm) which is incorporated as a relevant variable into the calculation of the capacitance but rather the thickness thereof (guide value 10 µm). It is thus possible to achieve a reduction in the coupling capacitance by approximately a factor of 100.

In addition to this desired effect in accordance with the invention, further useful field focusing is surprisingly achieved with the invention, as the inventors have been able to prove by means of simulation calculations. If e.g. the array in accordance with the invention is supplied from a transmitter and is partially or completely connected to the earth conductor of the strip line resonator via PIN-diodes of the conductor loop resonator, the axial profile of the magnetic high frequency field $B_1$ can be laterally restricted and the penetration depth in the object being examined can be varied. This can be utilized for improved imaging performance in the case of three-dimensional imaging. In addition, improved separation of the individual field profiles of the conductor strip and strip line resonators, e.g. in a radial array of the individual antennas, results. This aspect is also a useful characteristic (in particular for an application for parallel imaging with methods such as SENSE or GRAPPA) which characterizes the invention with respect to conventional arrangements.

In accordance with a second aspect, the said objective of the invention is achieved by the general technical teaching of providing an antenna array which comprises a plurality of antennas in accordance with the invention. The antenna array is a group of antennas which are combined to form a field (array). It is used to generate and receive alternating magnetic fields in the near field for use in MR-imaging and MR-spectroscopy. It is suitable in particular in the case of transmission for the local excitation of limited areas or homogenization of the excitation in particular at higher frequencies. During the reception of MR-signals, it is characterized by an increase in the SNR in regions near to the coils and/or by accelerated image acquisition.

A further important advantage of the antenna array in accordance with the invention is evident in the convenient manner in which it is produced. By arranging several antennas in accordance with the invention in a row alongside one another it is possible to create a three-dimensional array which optionally can be adapted geometrically to a predetermined shape of the object to be examined, i.e. a body region to be examined (e.g. the head or a joint), and permits a high degree of flexibility in terms of usage.

In accordance with a third aspect, the said objective of the invention is achieved by the general technical teaching of providing an MR-device which comprises at least one antenna in accordance with the invention and/or at least one antenna array in accordance with the invention.

In accordance with a fourth aspect, the said objective of the invention is achieved by the general technical teaching of providing a method for MR-imaging or MR-spectroscopy on an object which is to be examined, in which an excitation and/or detection of a magnetic resonance in the object is provided by at least one antenna in accordance with the invention and/or at least one antenna array in accordance with the invention. The method is characterized in particular by improved control of the at least one antenna. The method renders it possible in particular to influence the transmission and reception sensitivities of the antenna(s) and thus to optimize same during the examination.

The strip line resonator of the antenna in accordance with the invention is constructed by means of low-loss waveguides which are disposed on a dielectric or in a self-supporting manner and are resonantly tuned in relation to one or several Larmor frequencies. The function of the strip line resonator is based upon the facts known from transmission line theory that waves on waveguides are formed if a waveguide is not terminated by an ohmic resistor, whose size corresponds to the wave resistance. Characteristics of resonators based upon waveguides are known per se from the Prior Art. Details can be found e.g. in EP 1 624 314 A1 which is hereby introduced by reference into this description in particular with regard to the geometry, dimensioning, optimization and control of the strip line resonators which are based upon wave conductors.

In order to vary the antenna sensitivity, in particular to vary the field profile, at least one further, preferably layered conductor is disposed in accordance with the invention approximately perpendicular to the already provided strip line inside and/or outside the dielectric of the strip line resonator. The layered conductor forms a closed loop which is interrupted at least one location by means of at least one capacitor. By means of the at least one capacitor, optionally by using further reactances, the loop can likewise be tuned to one or several Larmor frequencies. The additionally attached, conductive structure which is resonantly tuned, but optionally also can be detuned, opened or short-circuited, is designated here as the "conductor loop arrangement". The antenna sensitivity is influenced by the conductor loop arrangement.

The inventors have found that the conductor loop arrangement which is attached additionally inside and/or outside the strip line resonator is substantially decoupled from the strip line resonator in the case of suitable dimensioning, or optionally can be decoupled additionally by capacitive or inductive decoupling networks. Thus, it is possible to control both the strip line resonator and also the conductor loop arrangement independently of each other. The fields generated by the strip line resonator and by the conductor loop arrangement are superimposed constructively or destructively in the object, which is to be examined, depending upon the phase position and amplitude of the connected transmitters. Therefore, the resulting field profile can be varied within broad limits and can be adapted to suit the requirements of the examination (e.g. so-called "HF-shimming" or parallel transmission techniques). The same applies to the reception: In this case it is also possible to use the signals individually or to combine them by means of phase shifters in a different manner and to use them for methods of parallel imaging.

A further advantage of the invention resides in the variability in the selection of the configuration of the conductor loop of the conductor loop arrangement. If the conductor loop in accordance with one variation of the invention forms a single ring or a single polygon, the structure of the antenna is advantageously simplified. In accordance with a modified variation, the at least one conductor loop can be provided in accordance with the invention with several rings or polygons which are disposed e.g. in the direction of the strip line of the strip line resonator and can be interrupted by a tuning network. The conductor loops comprise conductor portions which form a geometric loop shape.

In particular, the loop shape can comprise a so-called ladder form, in which lateral conductor portions form straight or curved spars and central conductor portions form straight or curved rungs. It can also be advantageous to interrupt connection pieces between conductor portions in a capacitive manner or with a tuning network. The conductor loop arrangement can consist alternatively of several ladder forms having at least three rungs, wherein the adjacent spars can be formed at a predetermined spaced interval, in an overlapping manner or by means of a common spar.

Further possible formations which deviate from the classic ladder form and which have shapes deviating from a rectangular shape or circular shape are expressly incorporated into the invention. The loop shape can comprise in particular a so-called chain shape, in which conductor portions are disposed in shape of a rhombus.

For example, several simple loops or double loops (so-called "figure-of-8-coils") or their mixed arrangements can be provided in the longitudinal or transverse direction of the strip line resonator. A double loop or "figure-of-8-coil" is generally a conductor loop, whose conductors in particular in the form of rings or polygons form a topological shape with two holes. A line which follows the progression of the "figure-of-8-loop" can be mapped onto the shape of the figure "8". The "figure-of-8-coil" can comprise e.g. a box shape having two square loops.

It is thus possible to provide a conductor loop arrangement having several conductor loops which form independent, separately controllable, resonant structures, so that the term conductor loop arrangement can also refer to an array of individual resonators. In accordance with the invention, it is also possible to add to the strip line resonator in particular several separate conductor loop arrangements inside and/or outside the dielectric of the strip line resonator, e.g. in the form of further conductor loops or as a ladder form structure or in an alternating fashion (e.g. simple loop and ladder form structure), with a spaced interval or in a partially overlapping manner and thus create an array of individual resonators, e.g. in the longitudinal direction of the strip line resonator. If at least one of the conductor loops comprises a ladder form and at least one further conductor loop comprises a simple loop (in particular a ring or polygon), advantages can be achieved in the specific application for the variability of the adjustment of the antenna sensitivity.

The array of individual resonators does not necessarily have to extend spatially along a straight line but can also extend along a curved line or a traverse. Such variable antennas for an MR-device in the form of a linear array can also be disposed repeatedly next to one another perpendicular to the direction of the above-described one-dimensional array and in this manner a two-dimensional array is acquired. Since the extension in this direction also does not necessarily have to extend along a straight line, a three-dimensional array having a very high packing density can thus also be created. The geometric shape of this type of three-dimensional array can also be adapted to the shape of the organs (areas) to be examined, which leads to optimum conditions both for the irradiation of the HF and also in the reception.

In accordance with a further modification of the invention, the antenna can comprise several conductor loop arrangements, optionally with the said variations, which are disposed one above the other. The conductor loop arrangements form a stack inside or adjacent to the strip line resonator. In an advantageous manner, further degrees of freedom for adjusting the antenna sensitivity are achieved in this case.

In accordance with a preferred embodiment of the invention, the antenna comprises a tuning device, by means of which the antenna can be tuned to at least one Larmor frequency. In an advantageous manner, the antenna can thus easily be adapted to various MR-examination tasks, e.g. to the measurement of a specific atom nucleus or various atom nuclei. There is a high degree of variability in the configuration of the tuning device which can be arranged e.g. for tuning various parts (individual resonators) of the antenna to different Larmor frequencies or for tuning predetermined parts of the antenna to several Larmor frequencies.

The tuning device can comprise a network of reactances (capacitances and/or inductances) which is connected to the antenna. The at least one capacitor of the conductor loop of the conductor loop arrangement is particularly preferred a part of the tuning device.

The flexibility of the adaptation to various measurement conditions can be advantageously increased, if the antenna in accordance with a further advantageous embodiment of the invention comprises a switching device, by means of which the antenna is connected to the tuning device, and by which the sensitivity of the antenna can be varied. Thus, in dependence upon the specific application or the specific position of the region of interest in the object, it can be necessary to open strip line resonators and/or conductor loop arrangements partially or completely, to detune them or optionally to short-circuit them. For this purpose, PIN-diodes ("positive intrinsic negative diodes") optionally in combination with varactor-diodes and/or further reactances are used in a particularly preferred manner. In an advantageous manner, a remote control of the switching device is thereby also permitted.

If a strip line resonator and/or a conductor loop arrangement is to be opened, then a suitably dimensioned inductance is connected in parallel with a voltage-fixed capacitor (e.g. the tuning capacitor) in the resonance circuit by means of a direct control voltage with a PIN-diode. The connectable inductance is dimensioned in such a manner that together with the selected capacitor it forms a parallel resonance circuit at the desired frequency.

If a strip line resonator and/or a conductor loop arrangement are to be detuned, then a suitably dimensioned capacitance (or even a varactor diode) is connected in parallel or optionally in series with the tuning capacitor in the resonance circuit by means of a direct control voltage with a PIN-diode. The connectable capacitance is dimensioned in such a manner that it tunes the resonance circuit to the desired new frequency. The controlled detuning can be useful as an intermediate stage for optimizing sensitivity profiles in specific applications (HF-shimming, local excitation, local reception).

However, if a strip line resonator and/or a conductor loop arrangement are to be short-circuited, then this can be accomplished in the most convenient manner, in that conductively connected PIN-diodes are disposed over the capacitors of the strip line resonator and/or the conductor loop arrangement and are short-circuited by means of a direct control voltage.

In an advantageous manner, the antenna in accordance with the invention can be formed exclusively as a transmitting antenna. In this case, the at least one capacitor in the conductor loop and the remaining structure are designed for the voltages in the kV-range which occur during transmission. The capacitance is e.g. at least 0.1 pF, preferably at least 0.5 pF. In the same manner as the strip line resonator, the conductor loop arrangement can also be connected in the transmission scenario to the transmitter via the at least one tuning capacitor or a tuning network and a matching arrangement. Alternatively, the antenna in accordance with the invention can be formed exclusively as a receiving antenna. In this case, the at least one capacitor in the conductor loop is designed for the voltages in the mV-range which occur during reception, wherein the capacitance amounts to e.g. 0.1 pF, preferably at least 0.5 pF, and the antenna is connected to a preamplifier. In the same manner as the strip line resonator, the conductor loop arrangement can also be connected in the reception scenario to a preamplifier via the at least one capacitor (tuning capacitor) or a tuning network and a "matching" arrangement.

However, in a preferred manner the antenna in accordance with the invention is formed as a transmitting/receiving antenna. In this case, each strip line resonator and each conductor loop arrangement can be coupled either to a receiver or a transmitter of the MR-device via a change-over switch. Owing to its function, the change-over switch is also defined as a T/R-change-over switch (transmitter/receiver).

The method in accordance with the invention is thus characterized by virtue of the fact that the antenna is used as a transmitting antenna, receiving antenna or as a transmitting-receiving antenna or in alternating operation or for a transmission-side or reception-side parallel imaging technique or a combination of the two methods.

A further important advantage of the invention resides in the high degree of flexibility in adapting to various examination tasks. The antennas of the antenna array in accordance with the invention can thus be disposed on a curved surface. In conjunction with the adjustability of the antenna sensitivity, all desired magnetic field directions and/or amplitudes in the object to be examined can thus be generated (transmit) or detected (receive) in the MR-device. In particular, the antennas can be disposed on a surface which is curved in such a manner that an examination space is formed which is arranged for receiving the object to be examined. The curved surface encloses a hollow space, in which the object can be disposed in the MR-device.

Furthermore, the at least one antenna can be disposed in the MR-device in such a manner that the antenna sensitivity is at its maximum in the radial direction relative to the static magnetic field of the MR-device, wherein advantages can be achieved with respect to a high degree of sensitivity of the MR-examination. Alternatively, the antenna can be disposed in a twisted manner (i.e. along a helix) with respect to the direction of the static magnetic field.

By tilting the antenna relative to the static magnetic field, a compromise can be reached between improved acceleration in the z-direction and a high degree of sensitivity in the x-y-direction.

BRIEF DESCRIPTION OF THE DRAWINGS

Further details and advantages of the invention are described hereinafter with reference to the accompanying drawings, which show in.

PREFERRED EMBODIMENTS OF THE INVENTION

Embodiments of the invention are described hereinafter with reference by way of example to antennas, whose conductor loop arrangement comprises at least one rectangular conductor loop having a conductor or conductor portions in the form of a layered strip and/or a bar, e.g. a round bar. The implementation of the invention is not restricted to the illustrated examples, but can be accomplished in a corresponding manner with conductor loop arrangements which comprise differently formed conductor loops and/or conductors having a different cross-section. Furthermore, deviating from the illustration the conductor of the conductor loop arrangement can comprise an angle, which differs from 90°, relative to the strip line resonator. Furthermore, the invention is described hereinafter with reference by way of example to antennas having a strip line resonator, which extend along a planar reference surface (reference plane). Accordingly, the invention can be implemented with curved reference surfaces.

Finally, it should be noted that the capacitance values stated below represent example values which in the practical application can be adapted to the specific circumstances in particular in dependence upon the loading of the coils with tissue. The person skilled in the art can use the example values as starting values, in order to achieve values for a specific application after simulation calculations, which are known per se, and fine-tuning. For simulation calculations, it is possible to use e.g. the software HFSS (High Frequency Structure Simulator, produced by: Ansoft, Version 11) in combination with the software "Designer" (produced by: Ansoft, Version 3.5). Finally, the invention described here with reference to MR-imaging can also be applied in a similar manner in EPR-technology.

Figure 1:
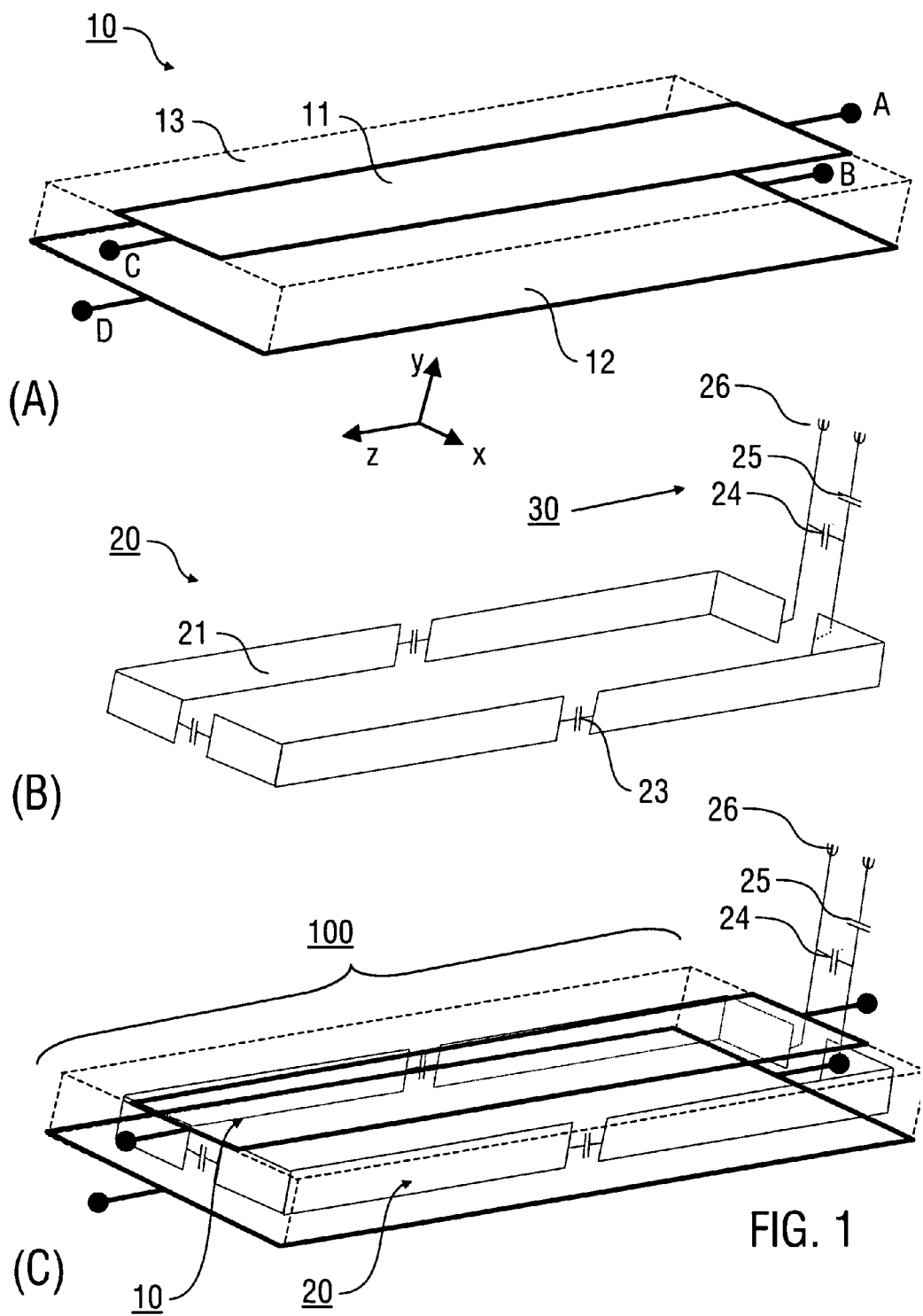
FIG. 1 a first embodiment of an antenna in accordance with the invention.

FIG. 1 illustrates a first example of the inventive variable antenna 100 (FIG. 1C), whose components, namely the strip line resonator 10 and the conductor loop arrangement 20 are shown individually in FIGS. 1A and 1B for reasons of clarity.

The strip line resonator 10 of the antenna 100 comprises a first conductor strip 11 and a second conductor strip 12 (conductor film 12) which are separated by means of a dielectric 13 (FIG. 1A). The strip line resonator 10 is constructed in a manner which is known per se. Guidelines for designing the strip line resonator 10 can be found e.g. in the publications Bahl I J, Trivedl D K. A designer's guide to microstrip line. Microwaves, May 1977; 174-179; Schnieder F, Heinrich W. Model of thin-film microstrip line for circuit design. IEEE Trans. Microwave Theory Techniques 2001; 49: 104-110; Itoh T. Overview of quasi-planar transmission lines. IEEE Trans. Microwave Theory Techniques 1989; 37: 275-280.

Provided on a first, non-short-circuited end of the strip line resonator 10 are the connections NB, at which the strip line resonator 10 is coupled and tuned via a tuning device 30.

The electrical coupling of the strip line resonator 10 can be performed capacitively (at voltage maximum) or inductively at current maximum. By means of a parallel capacitor (tuning capacitor) the strip line resonator can be tuned to the desired Larmor frequency. The coupling to the transmitter/receiver is effected via one or several series capacitors (matching capacitors). The resonance frequency is selected according to the Larmor frequency of the examined atomic nuclei which e.g. for hydrogen nuclei (protons) amounts to 127.7 MHz and for phosphorous nuclei amounts to 51.8 MHz in a static magnetic field of 3.0 T.

It should be noted at this juncture that the strip line resonator 10 can be tuned to the Larmor frequency for protons in the case of other field strengths, or to the Larmor frequency for other nuclei having a non-zero nuclear spin or for several Larmor frequencies and that the tuning capacitor(s) does/do not necessarily have to be attached to the open end of the strip line but can also be attached to other locations (e.g. as a bridge in the dielectric). It should also be noted that in order to fulfill the resonance condition, correspondingly dimensioned, discrete reactances can additionally also be applied to different locations on the strip line.

Provided at a second end of the strip line resonator 10 are the connections C/D, at which the strip lines are terminated. In the present case, an open termination is illustrated, wherein other terminations can also be advantageous (short-circuit, capacitive, inductive, ohmic resistance, see also FIG. 16). A predetermined field progression of the strip line resonator 10 is formed in particular in dependence upon the termination.

The width of the strip line 11 amounts e.g. to 1.5 cm. The dimensions of the dielectric 13 (polypropylene, PP, in the application example) amount e.g. to 7 cm (width), 1.5 cm (thickness) and 30 cm (length). The specified dimensions are merely an example and can be varied within broad limits in dependence upon the application conditions. The underside of the dielectric is coated with about 5 cm-wide conductor film 12 which comprises e.g. self-adhesive copper foil. For example, copper foil having a thickness approximately equal to twice the skin thickness (12 µm thick) was used, in order to minimize the formation of eddy currents.

It should be noted that the antenna in accordance with the invention can also be produced with differently dimensioned strip lines and with a different number of strip lines. It should also be noted that air (or a vacuum) can also be provided as a dielectric for the strip lines. For this case, the conductive layers are designed to be self-supporting or are stabilized on the opposing side in each case by means of a dielectric. In addition to PP as a dielectric, other dielectrics such as polytetrafluoroethylene (PTFE) or PTFE with inclusions of ceramic powder and other low-loss substrates can inter alia also be considered. Instead of adhering the conductor film, other metallization application methods can also be used.

The strip line 11 can also be modified in the following manner. The strip line can be terminated at the two ends, whereas a supply point is provided along the length of the conductor strip 11, e.g. on half of its length. In this case, the adjustment of the termination can be used in combination with geometric considerations for field optimization. If a short-circuit is assumed as a termination e.g. at both ends of the strip line resonator 10, this enforces a current maximum and thus also a field maximum at the two ends of the strip line 11. In the case of an open termination, the current maximum would be in the central region of the strip line 11. Furthermore, the strip line 11 can consist of several separate partial strips disposed next to one another, as known from the Prior Art.

In accordance with the invention, the variable antenna 100 contains the conductor loop arrangement 20 illustrated in FIG. 1B in addition to the strip line resonator 10 (FIG. 1A). The conductor loop arrangement 20 comprises a conductor loop 21, into which several capacitors 23 can be connected. The capacitors 23 are provided for the homogenization of the field generated by the conductor loop arrangement 20 and for the reduction of the interaction of the conductor loop arrangement 20 with respect to earth or other arrangements (via the electrical field). The capacitors 23 are positioned substantially equidistantly, so that the conductor loop is divided into conductor pieces of equal length which are connected via the capacitors.

In the simplest case, the conductor loop 21 of the conductor loop arrangement 20 consists e.g. of a conductor loop which is formed by means of a Cu-layer, having a length of 28 cm, a width of 7 cm, a strip width of the conductors of 5 mm and a thickness of the Cu-layer of 12 µm. In this embodiment, the width of the conductor loop 21 corresponds approximately to the width of the dielectric of the strip line resonator 10. The capacitors 23 include solid state capacitors, such as e.g. ceramic chip capacitors having non-magnetic contact surfaces which are electrically connected to the adjacent conductor pieces of the conductor loop 21.

In order to produce the complete antenna 100, the conductor loop arrangement 20 is partially embedded into the dielectric 13 of the strip line resonator 10. In an expedient manner, a groove is provided in the dielectric at the relevant locations, where the conductor is guided. In the simplest case, this can be performed mechanically by means of a cutter. Further examples of methods for producing the antenna are described hereinafter, in particular with reference to FIGS. 9 to 11.

The complete variable antenna 100 is illustrated in FIG. 1C. In this case, it comprises two connections 26, one for the strip line resonator and a further one for the conductor loop arrangement, at which high-frequency electrical power of a different phase length and amplitude can be supplied. In the simplest case, the connections 26 are connected both to the connection NB of the strip line resonator 10 and to the conductor loop 21 of the conductor loop arrangement 20 via a matching arrangement, optionally via power splitters and phase shifters. In the case of the reception of signals, the received signal can be tapped here directly (in the case of a pure receiving antenna) or via a T/R-change-over switch (in the case of a transmitting-receiving antenna, see FIG. 10).

In an expedient manner, one or several parallel capacitors from strip line 11 to strip line 12 can be used as a tuning capacitors ($C_T$) for the strip line resonator. These capacitors can be disposed at the end on the connection A/B and/or in the dielectric 13. In the case of the conductor loop arrangement, one or several capacitors is/are used in the conductor loop and are selected in terms of their value in accordance with the Thomson equation such that together with the associated partial inductances of the conductor loop they form a resonance at the desired Larmor frequency. In order to control the strip line resonator and the conductor loop arrangement, in each case an externally accessible tuning capacitor is used and is connected to one (or preferably several) series capacitor(s) 25 (matching capacitor, $C_M$) which are used for coupling-in the high-frequency voltage and for matching the resonators.

Figure 2:
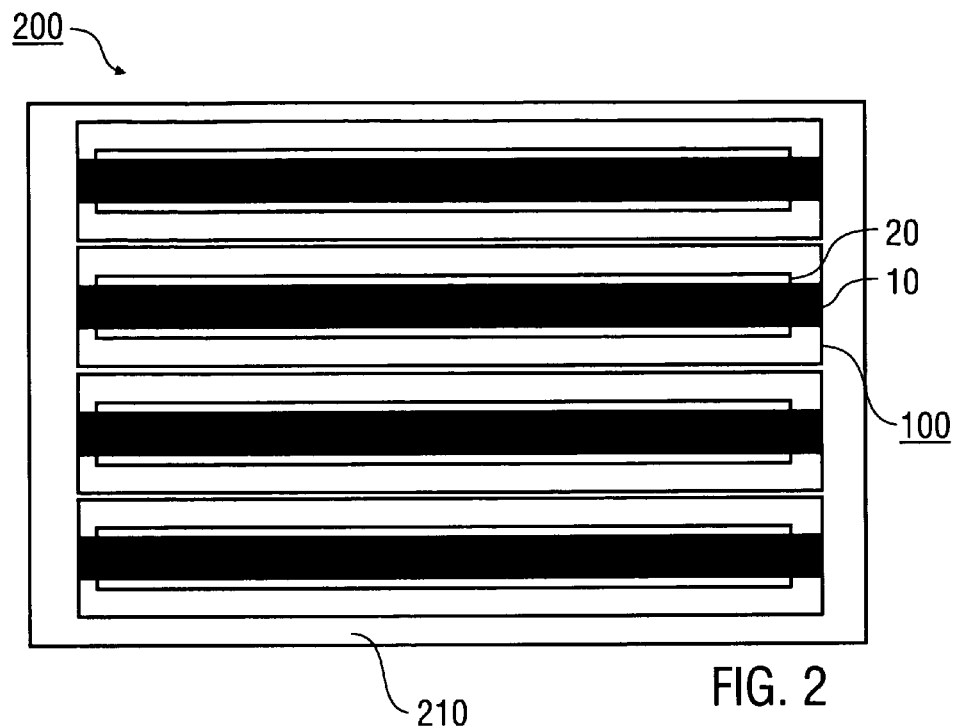
FIG. 2 a first embodiment of an antenna array in accordance with the invention.
Figure 3:
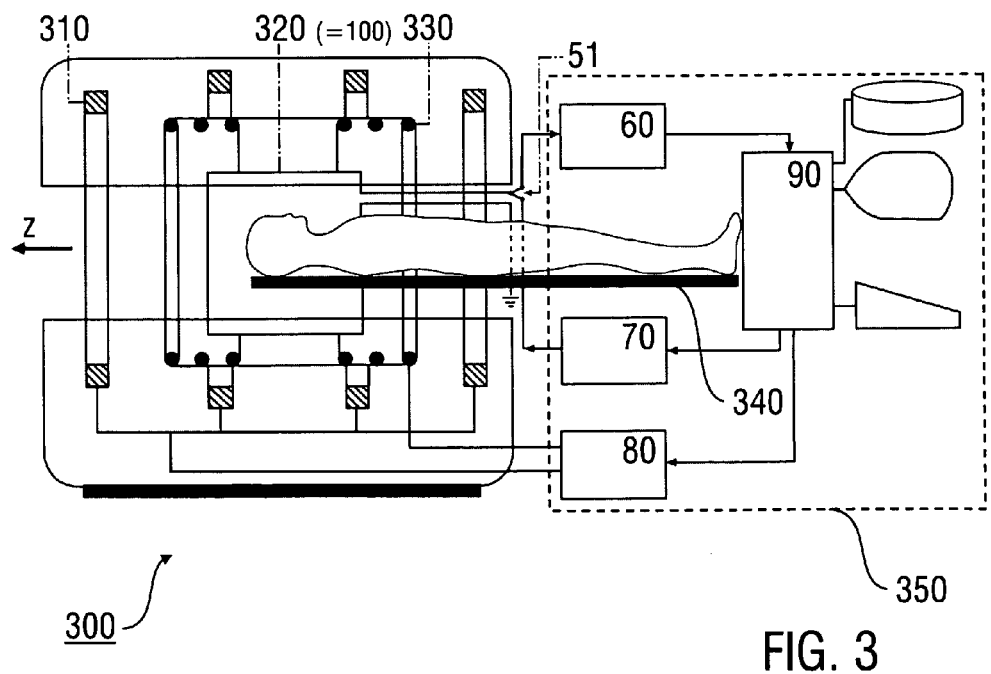
FIG. 3 a schematic illustration of a preferred embodiment of an inventive MR-device having an antenna array.

The individual strip line resonator 10 generates a magnetic field, as is known from conventional strip line resonators (see e.g. FIG. 16A, or FIG. 3 in EP 1 624 314 A1). In the case of a parallel arrangement of several strip line resonators (see e.g. FIG. 2), altered sensitivities can result in the event of a possible coupling between the resonators, as the strip line resonators can oscillate in different oscillation modes (see in particular FIG. 3 in EP 1 624 314 A1). In dependence upon the specific antenna array, a coil sensitivity image (field image) which has been altered in this way can be assumed for the control of the antenna 100.

By means of the conductor loop arrangement 20, whose resonance characteristics are determined by the dimension of the conductor loop 21, the capacitors 23 and the parallel and series capacitors 24, 25, an additional field is generated which is superimposed in a vectorial manner to the main field of the strip line resonator 10, so that the sensitivity of the complete antenna is formed. The varied entire field and the resulting antenna sensitivity depend upon the amplitudes and phases at the connections 26 of the resonators 10, 20, the geometric position of the two resonators with respect to each other and upon the position of the associated resonance frequencies. The formation of the varied entire field is illustrated by way of example in FIG. 6 for a modified embodiment of the invention.

It should be noted here that the field profile can be varied further as an alternative or in addition by means of further measures, such as e.g. a switchable partial damping or detuning of the individual resonators, in order to adjust e.g. an improved spatial HF-homogeneity during transmission.

FIG. 2 schematically illustrates by way of example an embodiment of an antenna array 200 in accordance with the invention. The antenna array 200 comprises four antennas 100 which as shown in FIG. 1 are each constructed with a strip line resonator 10 and a conductor loop arrangement 20. The antennas 100 are mounted on a common carrier 120 consisting of a dielectric material, e.g. plastic material.

Figure 17:
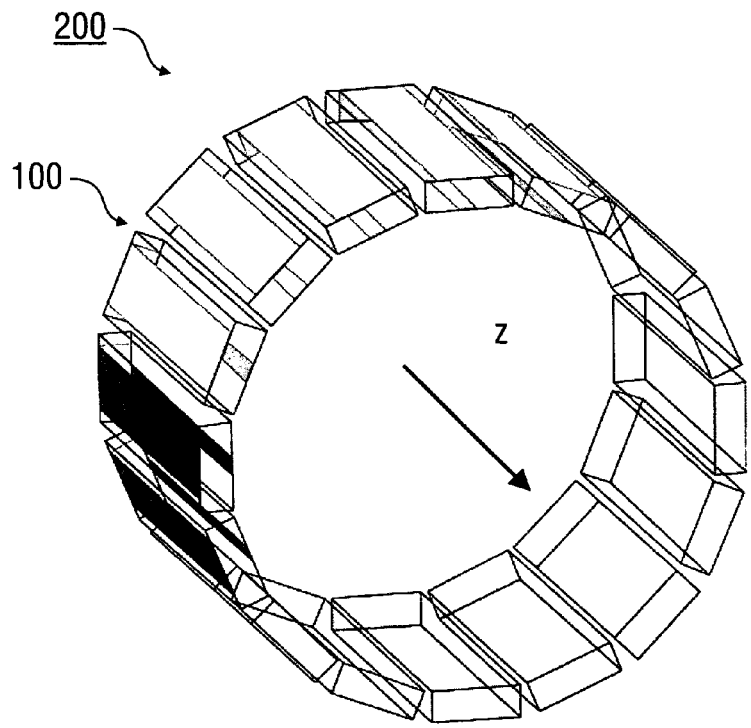
FIGS. 17A to 17F and 18 to 21 further embodiments of the antenna array in accordance with the invention.

It should be emphasized that the exemplified embodiment illustrated in FIG. 2 serves merely for illustrative purposes. The antenna array 200 can comprise fewer (at least two) antennas 100 or more (e.g. up to 128 antennas in accordance with the number of reception channels practically currently available) or furthermore, in particular up to 1024 antennas 100. The antennas 100 do not have to be disposed as illustrated adjacent one another in a direction perpendicular to the longitudinal direction of the strip lines. Alternatively, the antennas can be disposed in an offset manner and/or at varied spaced intervals. Furthermore, the antenna array 200 (just like any individual antenna 100) can be adapted to the shape of the object, e.g. to anatomical forms of an examined part of the body. In this case, the carrier 210 of the antennas is formed in a curved manner. An example including a three-dimensional antenna array is illustrated in FIG. 17.

FIG. 3 illustrates in a schematic sectional view a preferred embodiment of an MR-device 300 in accordance with the invention which comprises at least one antenna or antenna array in accordance with the invention. Apart from the antenna or antenna array, the MR-device 300 is constructed substantially in the manner of a conventional MR-device. It comprises a main coil 310 which is arranged for the generation of the static magnetic field $B_0$ in the z-direction, the transmitting/receiving coil 320, which is formed by at least one antenna 100 or antenna array in accordance with the invention, a gradient coil 330, which is provided for spatial encoding of the signals, a sample carrier 340, which is arranged to accommodate the object 1 to be examined (e.g. a human body or parts thereof), and a control unit 350 whose components are provided in particular for the control, energy-supply, data acquisition and operation of the MR-device 300. The control unit 350 comprises in particular a high-frequency receiver 60 and a high-frequency transmitter 70, a power supply 80 and a control computer 90 which is connected to further peripheral devices, e.g. a data storage device, a display device and an operating unit. A change-over switch 51 is provided for the purpose of switching the transmitting/receiving coil 320 (antenna 100) between the transmitting operation and the receiving operation. A plurality of change-over switches 51 can also be provided, e.g. for the antenna 100 and the conductor loop arrangement 20 or for antenna arrays 200.

The antenna 100 in accordance with the invention is disposed in the MR-device 300 such that the longitudinal direction of the strip lines 11 of the strip line resonator (e.g. FIG. 1C) extends in the z-direction, i.e. in parallel with the static magnetic field $B_0$. However, it is not absolutely necessary for the strip line 11 to be aligned in parallel with the z-direction. Alternatively, the antenna 100 can be tilted. In so doing, the coil sensitivity is inevitably reduced in the x-y-plane. However, this can be practical for anatomical reasons or even from the point of view of parallel-imaging. If e.g. antennas with the strip line resonators 10 are disposed in a tilted manner with respect to the $B_0$-field, e.g. on a cylinder outer surface, and if images are then recorded e.g. in the x-z-plane, several strip line resonators 10 are used in the z-direction, which can be useful for the purpose of accelerating image acquisition.

In accordance with the invention, the gradient of the $B_1$-field can be varied during the experiments and can thus be adapted to the requirements of the experiment, which can be performed e.g. with rapid switching diodes.

Figure 4:
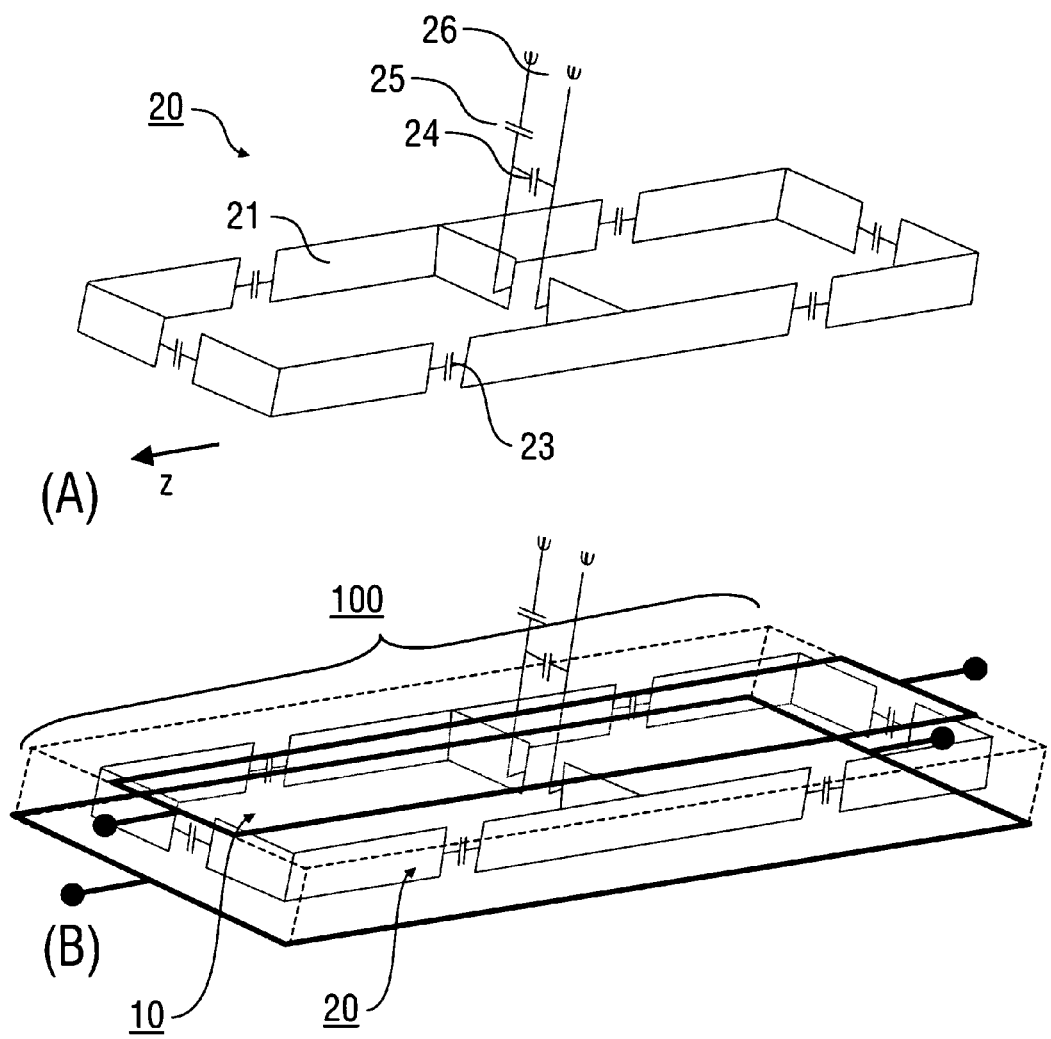
FIGS. 4 and 5 further embodiments of the antenna in accordance with the invention.

FIG. 4 illustrates the construction of a further embodiment of the antenna 100 in accordance with the invention which comprises the strip line resonator 10 and the conductor loop arrangement 20. The strip line resonator 10 is constructed in the manner described above with reference to FIG. 1A. The conductor loop arrangement 20 which is illustrated individually in FIG. 4A has the form of a so-called "figure-of-8-coil" which can also be described as a ladder form with three rungs and two spars.

The conductor loop arrangement 20 which is mounted laterally in accordance with the invention (FIG. 4A) and has three conductor portions which pass through the dielectric of the strip line resonator is capacitively bridged in the central conductor portion for supplying and tuning purposes, and is similar in terms of its geometric shape to the figure "8". In addition to this shape which is produced from two rectangles (and in technical terms is very easy to accomplish), it can also be favorable in specific applications, if the conductor loop arrangement is constructed from two ellipses or traverses. It is not absolutely necessary for the two parts of the conductor loop arrangement 20 in this embodiment to be identical in terms of their dimensions. By varying the geometry of the two parts, it is also possible to effect the desired adaptation of the transmission/reception profile.

In order to homogenize phase and to tune to the desired resonance frequency, several capacitors 23 are introduced into the conductor loop arrangement 20 which is proposed in accordance with the invention. It is not absolutely necessary for capacitors to be attached at all illustrated positions. In the case of specific applications of the invention, a field profile which is non-symmetrical or deformed by reason of run-time effects can be desirable for parallel-imaging, for HF-shimming or for parallel transmission techniques. An externally switchable arrangement via PIN-diodes can be advantageous for increasing flexibility.

In this embodiment, the complete variable antenna is illustrated in FIG. 4B. It should be noted at this juncture that the field profile can be modified by the measures stated in relation to FIG. 1 or 2. In particular, it can be advantageous if several conductor loop arrangements having dimensions, which are reduced optionally in the longitudinal direction of the strip line resonator, are disposed in this direction at spaced intervals or in an overlapped manner. Where appropriate, the conductor loop arrangement 20 illustrated in FIG. 1 can also be disposed in an alternating manner with the conductor loop arrangement illustrated in FIG. 4. As a consequence, it is possible optionally to achieve improved HF-homogeneity in the transmission scenario and higher acceleration factors in parallel-imaging.

Figure 5:
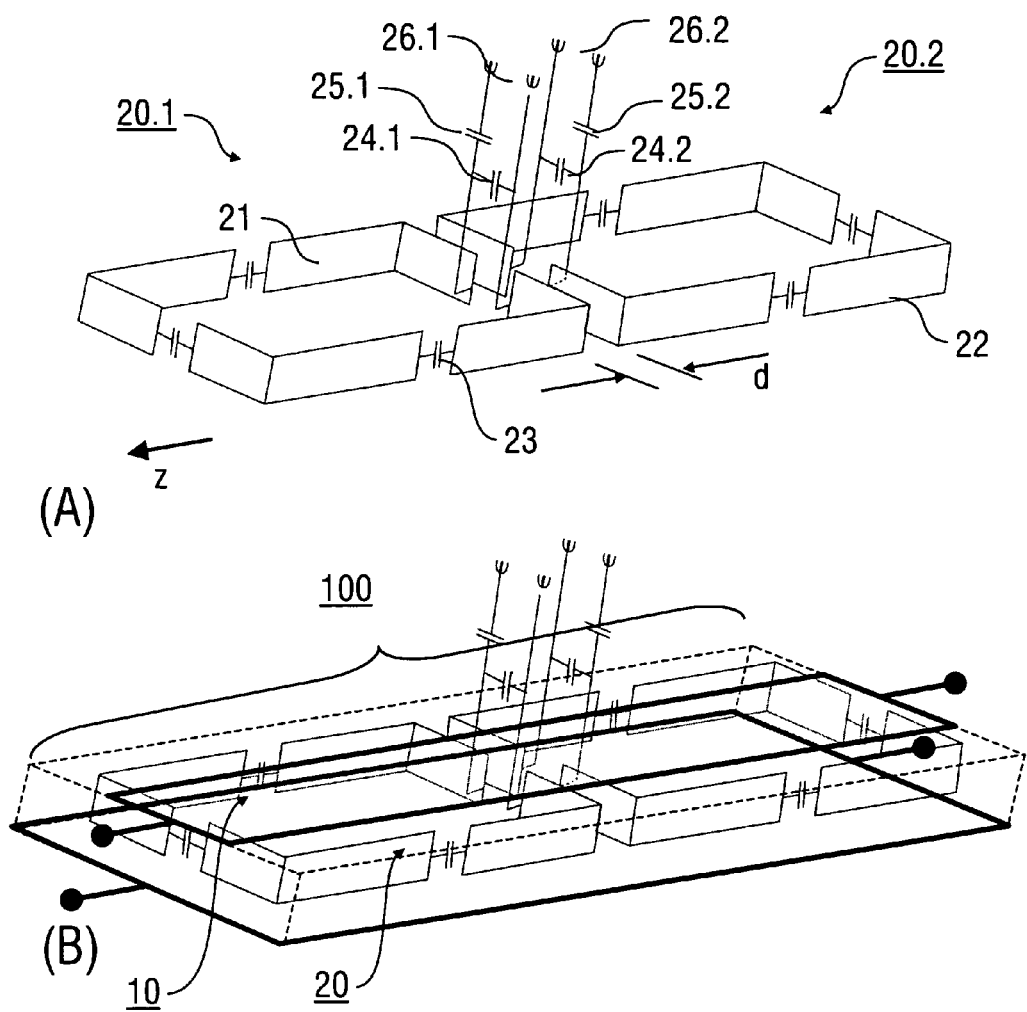

FIG. 5 illustrates a variation of the invention, in which the antenna 100 contains two conductor loop arrangements 20.1, 20.2. Each of the conductor loop arrangements 20.1, 20.2 has the configuration of the embodiment illustrated in FIG. 1. The conductor loop arrangements 20.1, 20.2 are disposed next to one another at a mutual spaced interval d. The spaced interval d is selected e.g. in the range of 1 mm to several cm, e.g. 1 cm or at most ten times the length of the individual loop. Additional decoupling capacitors and/or decoupling networks can also be disposed between the conductor loops.

Each of the conductor loop arrangements 20.1, 20.2 is connected to the separate connections 26.1, 26.2 via a dedicated network of parallel and series capacitors 24.1, 25.1 and 24.2, 25.2. In an advantageous manner, a level of flexibility in the adjustment of antenna sensitivity which is increased in comparison with the embodiment as shown in FIG. 4 can thus be achieved. Each of the conductor loop arrangements 20.1, 20.2 can be controlled independently of the respective other conductor loop arrangement.

Figure 6:
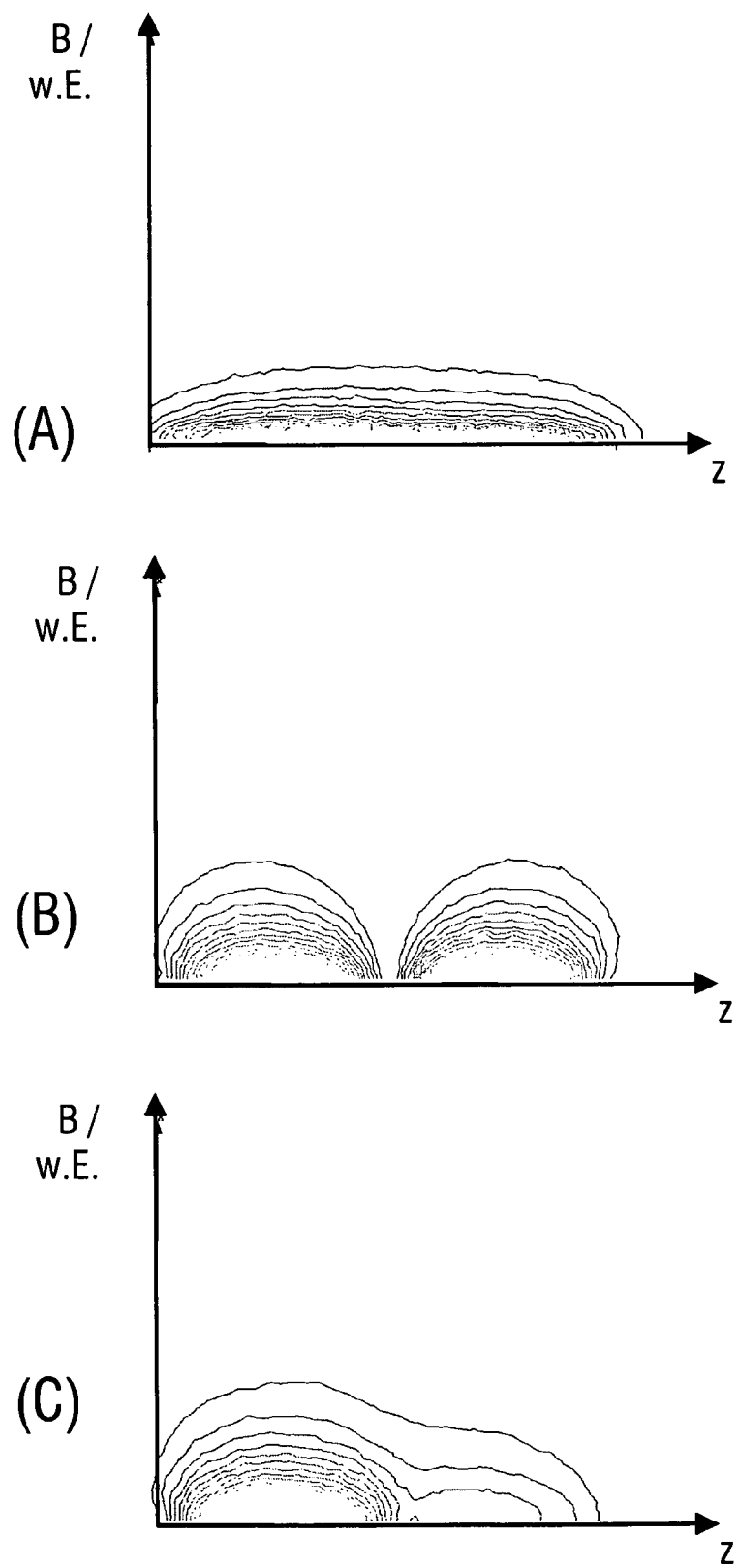
FIG. 6 an exemplary illustration of the antenna sensitivity of an antenna in accordance with the invention.

FIG. 6 illustrates by way of example how in accordance with the invention the field profile of the strip line resonator (FIG. 6A) and the field profile of the conductor loop arrangement (FIG. 6B), which in this case comprises an arrangement as shown in FIG. 4 or 5, are added to form a superimposed field profile of the antenna 100 (FIG. 6C). The superimposed field profile in FIG. 6C illustrates the antenna sensitivity which is structured in the z-direction, if e.g. an additional transmission amplitude is adjusted on one of the conductor loop arrangements.

It should be noted that the field profile can be modified further by virtue of the measures stated in the other exemplified embodiments. It can be advantageous for further conductor loop arrangements having reduced dimensions to be disposed in the direction of longitudinal extension of the strip line resonator.

Figure 7:
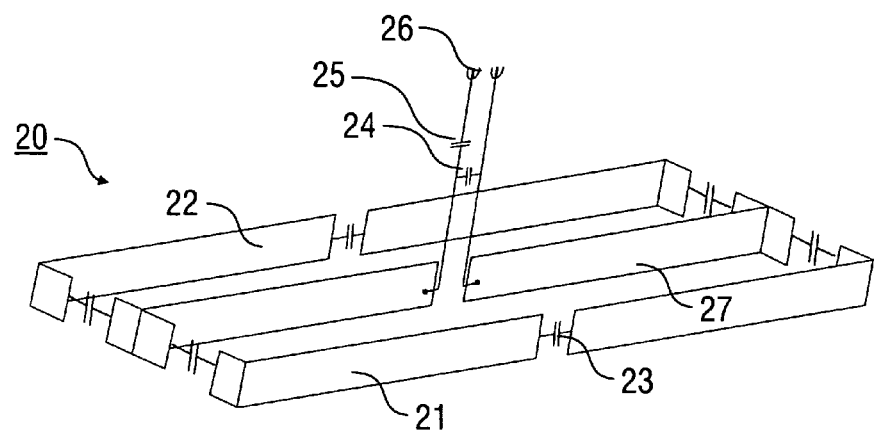
FIGS. 7 to 14 further embodiments of the antenna in accordance with the invention.
Figure 7:
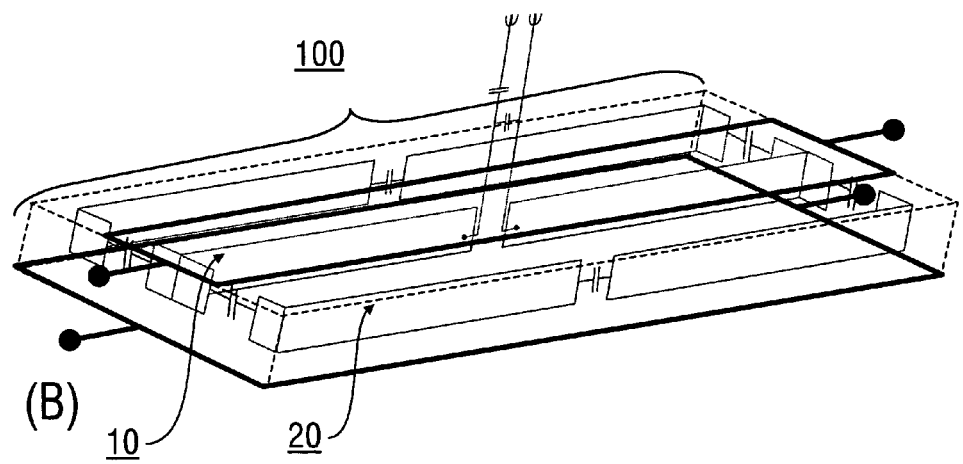
Figure 8:
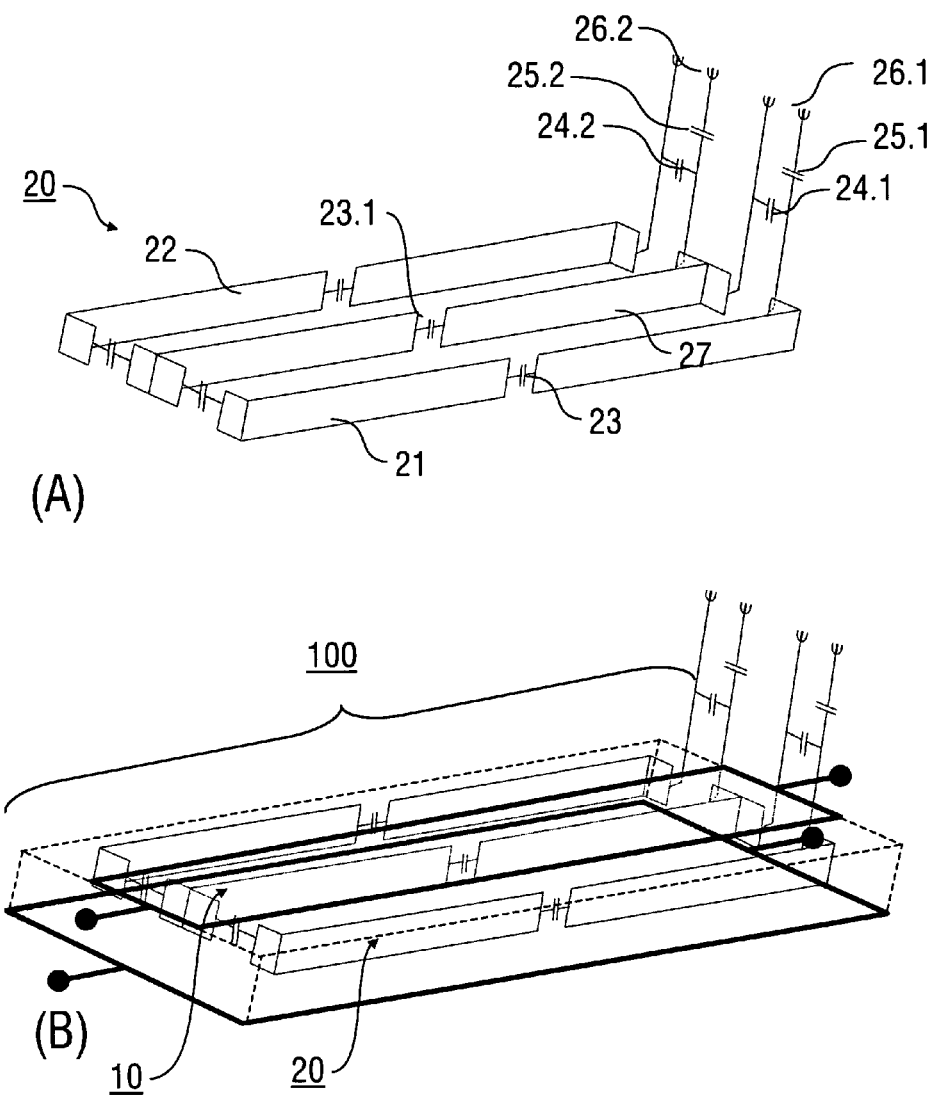

In the case of the embodiments of the antenna 100 as illustrated in FIGS. 7 and 8, the strip line resonator 10 as shown in FIG. 1A is likewise provided. However, the conductor loop arrangement 20 is divided in the direction of the longitudinal extension of the strip line resonator 10 by means of a further conductor 27. The central conductor portion 27 in FIG. 7 is interrupted by means of a network having the parallel and series capacitors 24, 25, and the connections 26. Alternatively (FIG. 8), the conductor 27 can be interrupted by means of a further capacitor 23.1 which is formed in the same manner as the capacitors 23 e.g. as shown in FIG. 1. With suitable dimensioning of the decoupling capacitor 23.1, two decoupled partial resonators are formed. The partial resonators can be used via the connections 26 or other separate supply points independently of each other for the purpose of controlling the antenna 100.

The embodiments as shown in FIGS. 7B and 8B are similar to a rotated "figure-of-8-coil". Due to the rotation, the field which is generated between the two partial resonators of the conductor loop arrangement 20 is also advantageously NMR-active. In particular, the embodiments as shown in FIGS. 7B and 8B can be used in order to nullify the field of the strip line resonator 10 partially or almost completely, to reverse it or to subject it to amplification by a predetermined amplification factor.

In addition to the shape which is illustrated in FIGS. 7A and 8A having two rectangles and which in technical terms is very easy to accomplish, it can be advantageous if the conductor loop arrangement is constructed in this embodiment from ellipses or traverses. It is also not absolutely necessary for the two parts of the conductor loop arrangement to have identical dimensions. By varying the geometry of the two parts, it is also possible to provide the desired matching of the transmission/reception profile of the antenna.

For the purposes of homogenization and tuning, a series of capacitors 23 is also introduced in this embodiment in the conductor loop arrangement 20 which is proposed in accordance with the invention. It is not absolutely necessary for capacitors to be attached at all illustrated positions. In some cases, a field profile which is non-symmetrical or deformed by run-time effects can certainly be desirable for the purposes of parallel-imaging, for HF-shimming or for parallel transmission techniques.

The capacitor 23.1 which as shown in FIG. 8 is disposed in the central conductor portion 27 can also be used for decoupling between the two parts of the conductor loop arrangement 20. In the event of a phase-shift of 180° between two supply points (connections 26.1, 26.2) of the two parts of the conductor loop arrangement, the variation produced in FIG. 7 is provided. For other phase-shifts different field profiles can be adjusted.

The complete variable antenna 100 is illustrated in FIGS. 7B and 8B respectively. In the case of these embodiments, the sensitivity profile is varied mainly in a plane perpendicular to the longitudinal extension of the strip line resonator (e.g. x-y-plane). If the strip line resonator 10 and the conductor loop arrangement 20 are controlled collectively, the field profile of the antenna 100 can be deformed in the desired manner. The transmission phases and amplitudes do not necessarily have to be identical.

Figure 9:
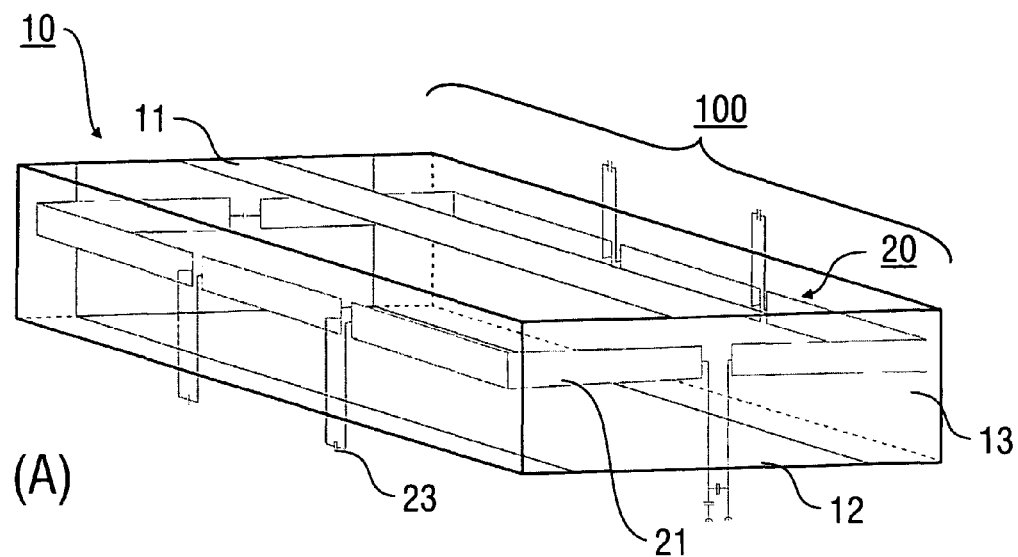
Figure 9:
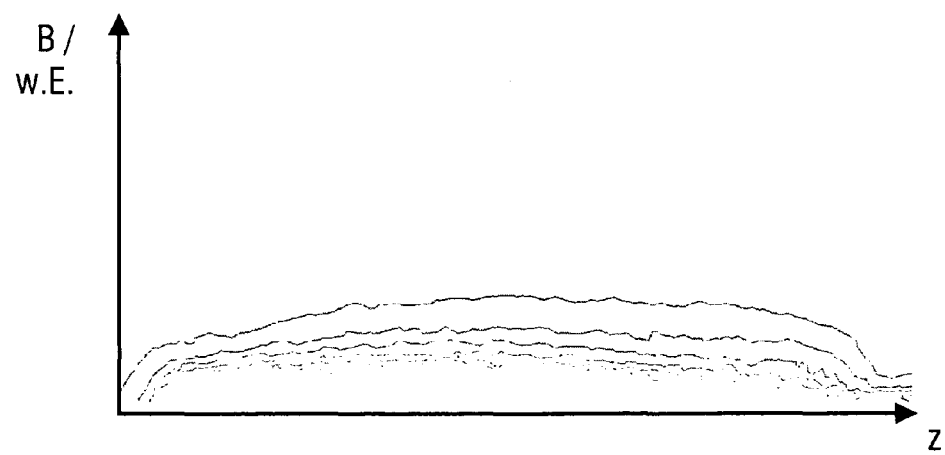

FIG. 9 illustrates a variation of the invention, in which the antenna 100 as a conductor loop arrangement 20 contains a simple conductor loop 21 which in relation to the insulating dielectric 13 is mounted partially laterally on the surface of the dielectric 13 and partially in such a manner as to pass through the dielectric 13 (FIG. 9A). The strip line resonator 10 is short-circuited on one side. FIG. 9B illustrates by way of example a field profile which is generated with the antenna 100.

For the purposes of simple implementation, the dielectric 13 (insulating body) consists of three PP-plates (thickness 5 mm; width 70 mm; length 300 mm). For the sake of simplicity, it is illustrated in this case as one piece. The central plate is divided into a 270 mm-long piece and two 15 mm-long pieces. Adhered to the lateral surfaces of the 270 mm-long central piece is an approximately 12 μm-thick copper foil having a width of 5 mm (corresponding to the thickness of the plate). This conductor is interrupted at the illustrated locations at a width of about 5 mm and is bridged with capacitors. In the case of a specific exemplified embodiment, a value of 20.9 pF for use of the strip line arrangement at 123.1 MHz (Larmor frequency for 1H at 2.9 T) has been found as the capacitance. This value is achieved e.g. by antimagnetic chip capacitors having a capacitance of 22 pF and at one or optionally also several locations as a parallel circuit of an antimagnetic chip capacitor (15 pF) having an antimagnetic variable capacitor (rotary capacitor, tube trimmer or the like) having a variable capacitance range of 0.5 pF to 10 pF.

The adjustment value for the variable tuning capacitor 24 amounts e.g. to 27.4 pF. The person skilled in the art knows that these specifications for the capacitors are guide values and other combinations also result in resonance at 123.1 MHz and that the resonance frequency can be shifted to lower frequencies by virtue of larger capacitances and can be shifted to higher frequencies by virtue of smaller capacitances.

With the dimensioning as set out above, this arrangement in the simplest case having an antimagnetic variable series capacitor 25 with an adjustment value of 39.9 pF is adjusted to 50 Ohms. This is also a guide value which is influenced by loading effects etc. Then at both end sides this arrangement is made into a total length of 300 mm by virtue of the 15 mm-long PP-end pieces which have been previously sawn off.

The two other PP-plates are then placed at the top and bottom of this arrangement, so as to form the PP-dielectric 13, which is illustrated in FIG. 9A as one piece, with the conductor loop arrangement. A self-adhesive, 50 mm-wide and 12 μm-thick Cu-foil 300 mm in length is adhered to the underside of this now 15 mm-thick insulating body. It should be emphasized that these dimensions are example values and other values are also possible. The lower strip 12 which is preferably wider for focusing the field of the strip line resonator 10 in the direction of the sample (not illustrated) is often defined as earth ("ground-conductor"). From the 10 μm-thick Cu-foil a narrower conductor 11 (e.g. 15 mm wide) at a length of 300 mm is applied to the top surface. At the end (at the back of FIG. 9A), a short-circuit for termination is provided which is likewise produced from a 50 mm-wide and 12 μm-thick, self-adhesive Cu-foil. A decoupling of ca. 50 dB is achieved between the conductor loop arrangement 20 and the strip line resonator 10.

For the purposes of electrical insulation, the variable antenna 100 which is produced in accordance with this method is encased in a heat-shrinkable tubing, e.g. consisting of polyolefin (colorless).

FIG. 9B illustrates by way of example the B1-field which is produced with the antenna 100, if the conductor loop arrangement 20 is controlled with a relative amplitude of 3 W and a relative phase of −90° and the strip line resonator 10 is controlled with a relative amplitude of 1 W and a relative phase of 0°.

Figure 10:
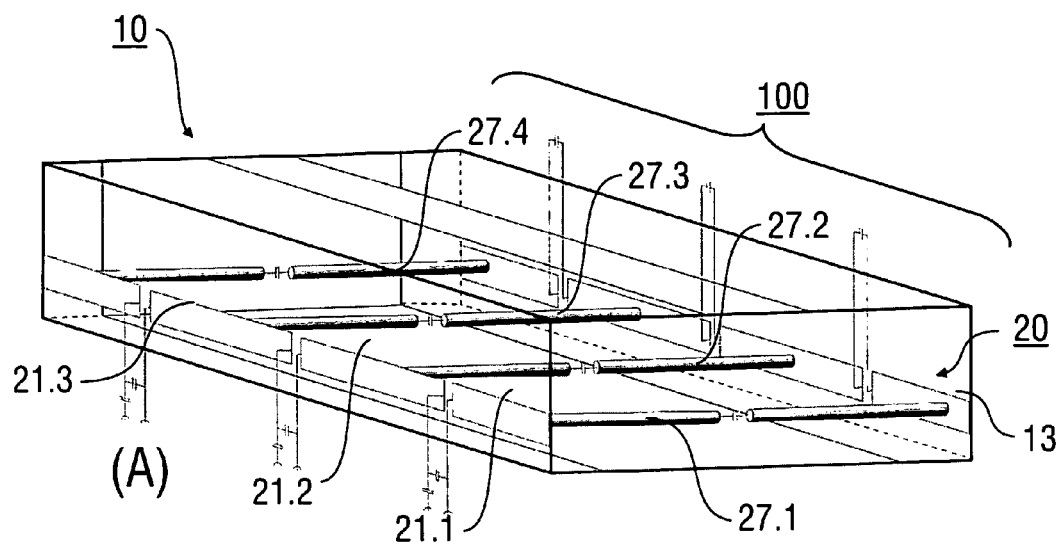
Figure 10:
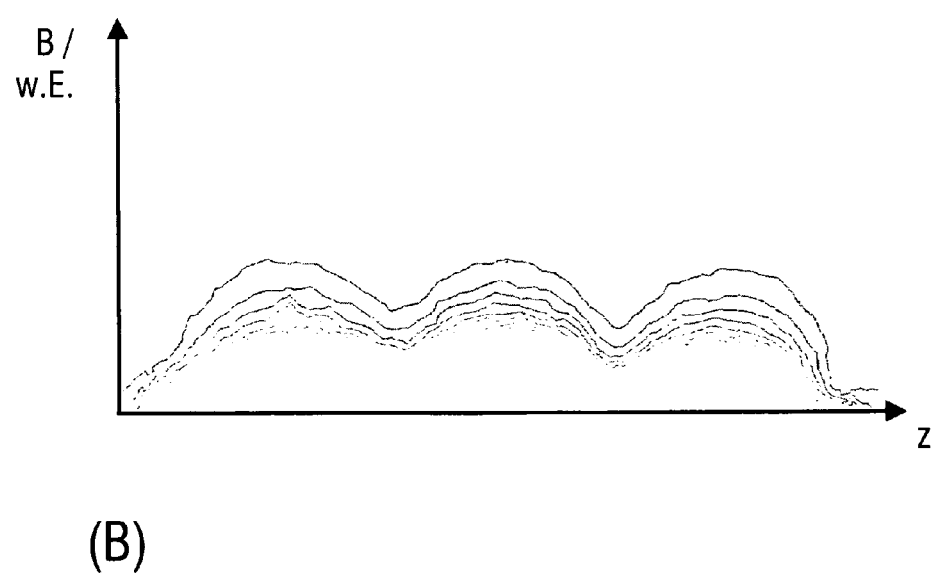

FIG. 10 illustrates a further variation of the invention, in which the antenna 100 as a conductor loop arrangement 20 contains several conductor loops 21.1, 21.2, 21.3 which are formed by means of parallel, bar-shaped conductors 27.1 in the insulating dielectric 13 (FIG. 10A). The strip line resonator 10 is short-circuited on one side. FIG. 10B illustrates by way of example a field profile which is produced with the antenna 100.

In the manufacture of the controllable antenna 100, 3 plates consisting of PP are likewise used as the starting point (5 mm thick, 7 cm wide and 30 cm long). In each case, two slots (about 1 mm wide) are cut into one of the three plates as far as the centre of the plate in a symmetrical manner with respect to the centre at a spaced interval of 4.75 cm (or 14.25 cm). These slots serve to accommodate the four wires interrupted in the centre to form the bar-shaped conductor. The wires (Cu, silver-plated-Cu or similar materials having a high conductivity with respect to the HF) have a diameter of about 1 mm. The two outer conductor bars 27.1, 27.4 are capacitively bridged in the centre with 48.3 pF, whereas for the two central conductor bars 27.2, 27.3 a value of 47.2 pF has proven to be optimum for decoupling between the partial loops 21.1, 21.2, 21.3 of the conductor loop arrangement 20.

The high-frequency power for this complex conductor loop arrangement 20 is supplied via one or several tuning capacitors 24, which is disposed laterally at an interruption of the conductor loop, e.g. 24.6 pF. In the illustrated example, the high-frequency power can be applied at three locations, in order to influence the behavior of the conductor loop arrangement 20. In order to adapt to the cable, variable capacitors 25, e.g. 5 to 25 pF, are used which are adjusted to a value of e.g. 9.9 pF. The interruptions on the opposite side of the conductor loop are capacitively bridged with 24.7 pF.

It should be noted that the capacitance values stated in this case can be adjusted by variable capacitors or by a combination of a variable capacitor and a fixed capacitor. For this purpose, it is possible to use e.g. trimming capacitors (2 to 50 pF). The examples stated are guide values which can be varied as required.

A respective further PP-plate (30 cm long, 7 cm wide and 5 mm thick) is placed on to the top and bottom of the central plate prepared in this manner. The strip line resonator 10 consisting of an approximately 12 μm-thick, self-adhesive Cu-foil is adhered to the outer surfaces of this insulating body which is manufactured as a stack. The upper conductor 11 is 15 mm wide and 30 cm long, whereas the short-circuit termination at the end of the dielectric 13 and the lower conductor 12 are produced from 5 cm-wide and 12 μm-thick, self-adhesive Cu-foil. Disposed at the open end opposite the short-circuit is a tuning capacitor 24, ca. 3 pF. In the simplest case, the strip line resonator is connected with an adaption capacitor 25, about 3 pF.

The individual conductor loops 21.1, 21.2, 21.3 of the conductor loop arrangement 20 are decoupled from one another at about 20 dB, whereas the decoupling with respect to the strip line resonator is about 40 dB.

FIG. 10 illustrates by way of example the B1-field which is produced with the antenna 100, if all of the conductor loops 21.1, 21.2, 21.3 of the conductor loop arrangement 20 are controlled in phase opposition.

Figure 11:
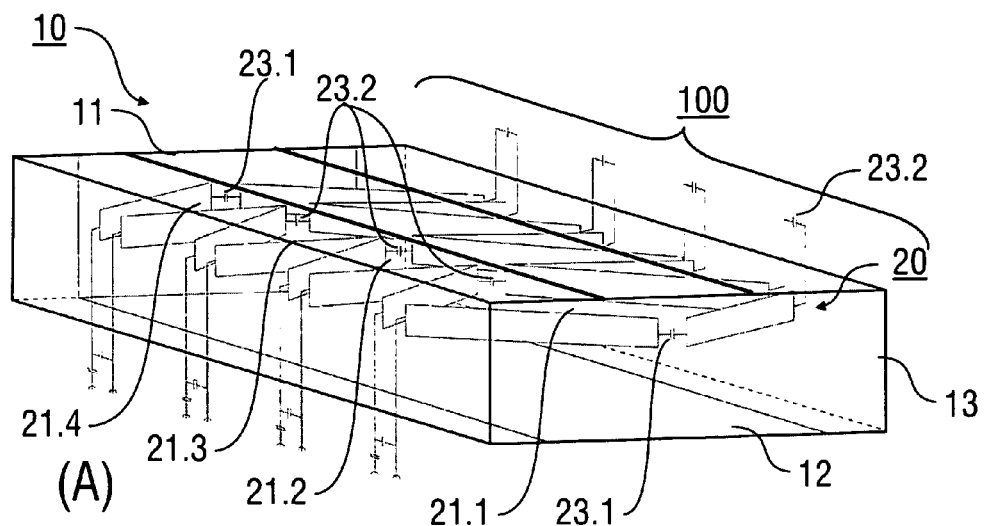
Figure 11:
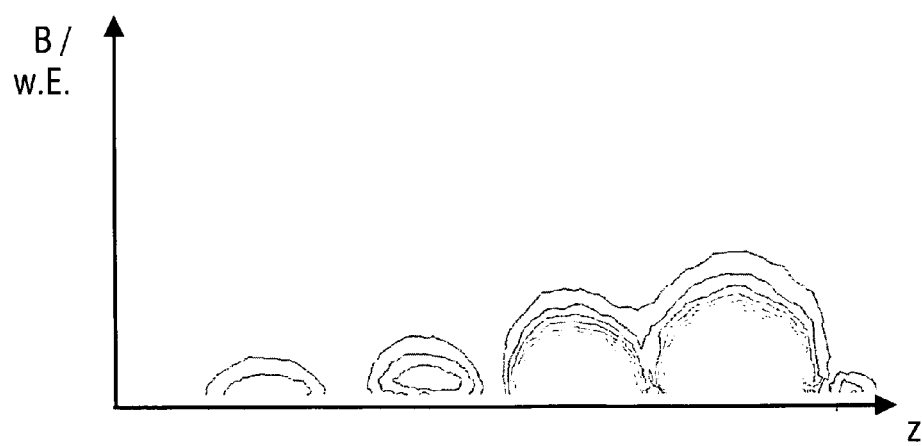

FIG. 11 illustrates a further variation of the invention, in which the antenna 100 as a conductor loop arrangement 20 contains four rhomboidal conductor loops 21.1, 21.2, 21.3, 21.4. To manufacture the controllable antenna 100 (FIG. 11A), three PP-plates (5 mm thick, 7 cm wide and 30 cm long) are likewise used. Squares having an edge length of ca. 5 cm are cut into one of the three plates symmetrically with respect to the centre. These openings are bonded at their inner cut surfaces to form the conductor loops with a conductive film. The interruptions at the right-hand corner of the right-hand square and at the left-hand corner of the left-hand square are bridged by capacitors 23.1, whereas the locations where the conductor loops adjoin one another in the centre of the plate are bridged by capacitances 23.2 of 350 pF. The two outer conductor loops 21.1, 21.4 are tuned at 26.5 pF and matched at 4.2 pF. Located opposite the tuning capacitor is a respective capacitor with a value of 75.3 pF. The two central conductor loops 21.2, 21.3 are tuned at 22 pF and matched at 3.5 pF. Located opposite the tuning capacitor is a capacitor at 73 pF. The strip line resonator 10 is tuned at 2.9 pF and matched at 3.2 pF. It should be noted that the capacitance values stated in this case can be adjusted by variable capacitors or by a combination of a variable capacitor and a fixed capacitor. The stated examples are guide values which optionally can be modified.

After the Cu-strips and the capacitances are applied, the remainder of the openings are then filled with PP at a thickness of 5 mm, in order to minimize or obviate any interference to the field in the dielectric 13. A respective further PP-plate (30 cm long, 7 cm wide and 5 mm thick) is placed onto the top and bottom of this central plate prepared in this manner. The strip line resonator 10 made of 12 μm-thick, self-adhesive Cu-foil is adhered to the outer surfaces of this dielectric 13 (insulating body) which is manufactured as a stack. The upper conductor 11 is 15 mm wide and 30 cm long, whereas the short-circuit termination conductor and the lower conductor 12 are manufactured from 5 cm-wide and 12 μm-thick, self-adhesive Cu-foil. Disposed at the open end opposite the short-circuit is a tuning capacitor (ca. 3 pF). In the simplest case, the strip line resonator 10 is connected with an adaption capacitor (about 3 pF). The individual conductor loops of the conductor loop arrangement 20 are decoupled from one another at about 20 dB, whereas the decoupling with respect to the strip line resonator is about 40 dB.

FIG. 11B illustrates by way of example the B1-field which is produced with the antenna 100, if all of the conductor loops 21.1, 21.2, 21.3, 21.4 of the conductor loop arrangement 20 are controlled with different amplitudes and phases.

Figure 12:
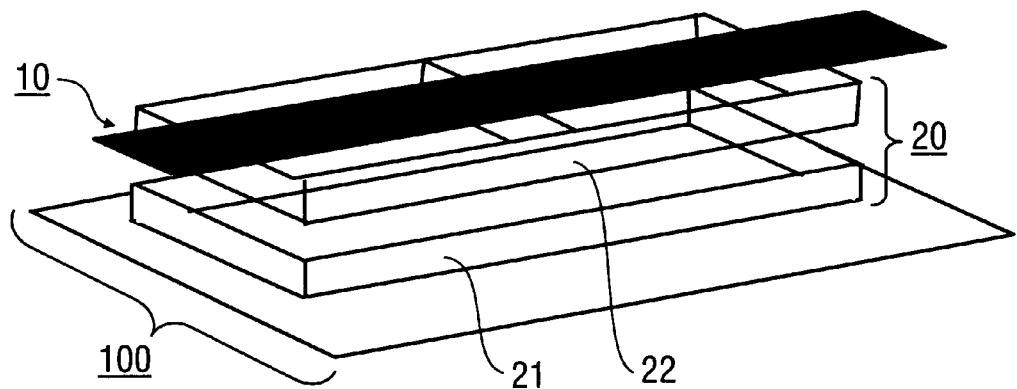
Figure 13:
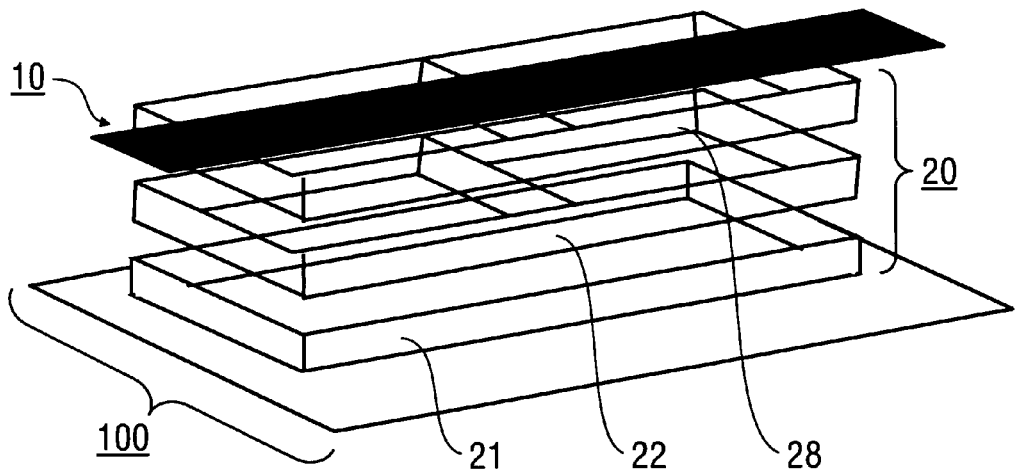
Figure 14:
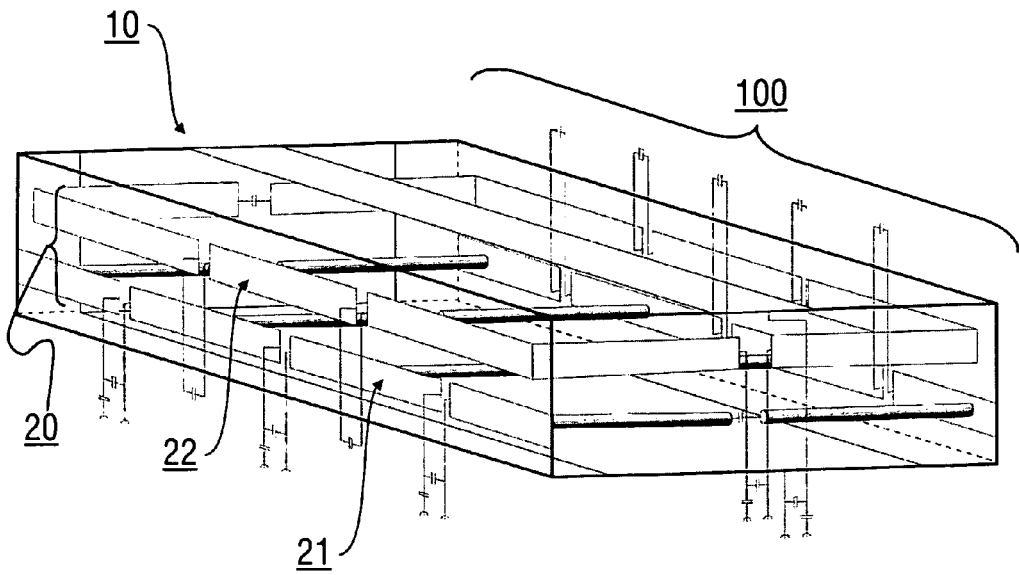

FIGS. 12 to 14 schematically illustrate further embodiments of the antenna 100 in accordance with the invention, in which the conductor loop arrangement 20 comprises several conductor loops 21, 22 (and 28). The conductor loops 21, 22, 28 form a stacked structure in the dielectric 13 of the strip line resonator 10. The form of the individual conductor loops can be selected in dependence upon the requirements of the selected invention. For example, simple loops (as shown in FIGS. 1B, 9) or "figure-of-8-arrangements" (as shown in FIG. 4A, 10) or combinations thereof can be provided.

It should be noted that the formation of the conductor loop arrangement can be extended with several conductor loops in several directions (e.g. with several parallel conductor portions).

For example, as shown in FIGS. 12 and 14 two conductor loops 21, 22 are disposed one above the other. For this variation of the invention, a simple strip line resonator 10 as shown in FIG. 1A is also used. The conductor loop arrangement 20 which protrudes laterally in accordance with the invention consists of two conductor loops 21, 22. In the case of an exactly symmetrical structure of the arrangement of FIG. 12, the strip line resonator 10 and the two conductor loops 21, 22 lying one on top of the other are decoupled, so that the phases and amplitudes at the three supply points of the strip line resonator 10 and the conductor loops 21, 22 can be selected advantageously independently of each other. This provides favorable conditions for parallel-imaging, for HF-shimming or for parallel transmission techniques.

It should be noted here that the field profile can be modified, in that several conductor loop arrangements are disposed, in accordance with the example of FIG. 12 having dimensions which are reduced in the longitudinal direction of the conductor strip resonator, at a spaced interval or in an overlapped manner in this direction. In an advantageous manner, the conductor loops can be disposed stacked in an alternating fashion with or without a spaced interval in the longitudinal direction of the strip line resonator 10. As a consequence, improved HF-shimming is achieved in the transmission scenario and higher acceleration factors are achieved in parallel-imaging.

Where required, the stacking principle illustrated in FIG. 12 can be extended e.g. as shown in FIG. 13. Where appropriate, measures can be implemented for decoupling between conductor loop arrangements lying one on top of the other in accordance with the Prior art. In particular, three conductor loops 21, 22, 28 can be disposed one on top of the other. In accordance with further modifications, more than three, e.g. five or more conductor loops disposed one on top of the other can form a stack. The conductor loops can be aligned as illustrated in the stack in a flush manner relative to one another or can be disposed in an offset manner relative to one another.

Figure 15:
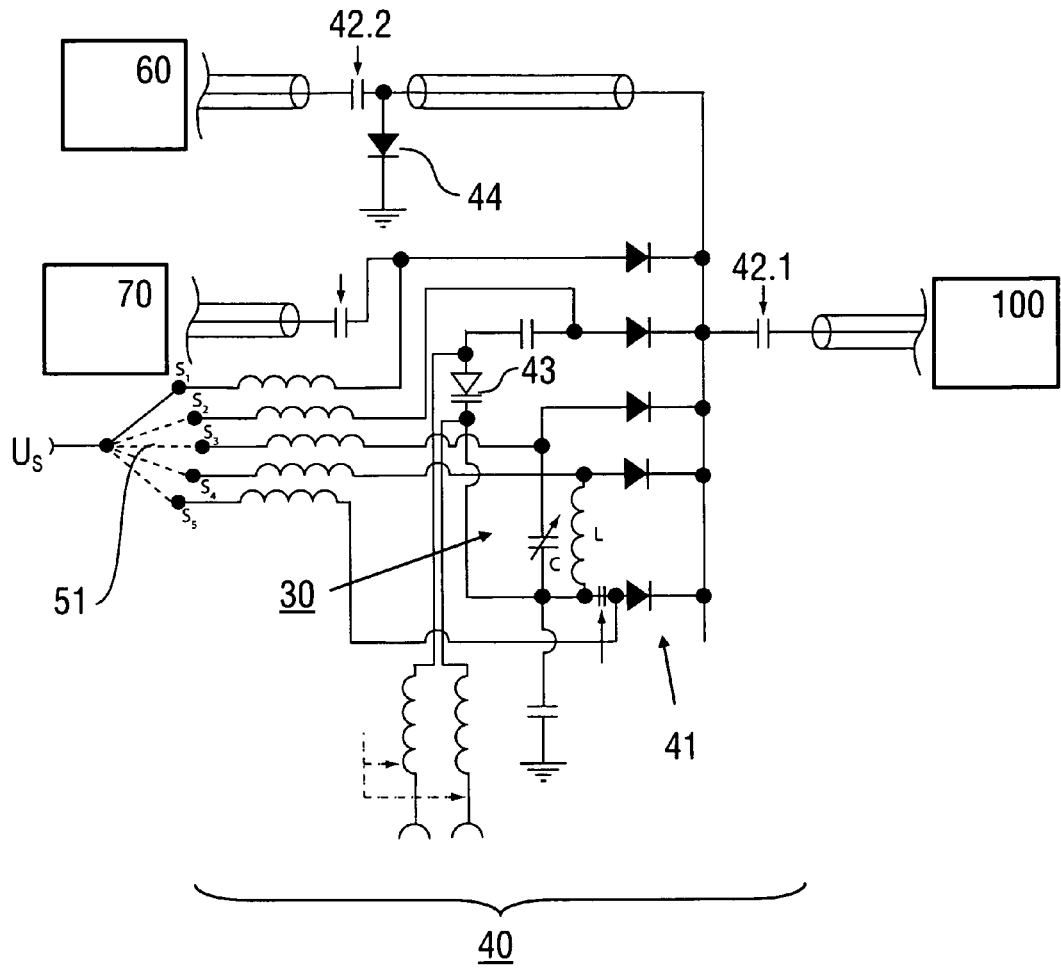
FIGS. 15 and 16 schematic illustrations of circuits for controlling or tuning the antenna in accordance with the invention.

FIG. 15 illustrates by way of example an embodiment of a switching device 40 which is provided for connecting the antenna 100 to the receiver 60 or the transmitter 70 of the MR-device (see FIG. 3). The switching device 40 is provided in each case for use on the strip line resonator 10 and on the conductor loop arrangement(s) 20. The switching device 40 comprises a group of PIN-diodes 41 which are connected to one of the connections (26, see e.g. FIG. 1B) of the antenna 100 via a separating capacitor 42.1 and a coaxial line. The switching device 40 also comprises a change-over switch 51, by means of which a positive switching voltage $U_S$ (e.g. +5 V) can be selectively connected to one of the PIN-diodes 41.

At +5 V a sufficiently high current flows through the corresponding diode and it is low-ohmic. It switches the corresponding component on. For the sake of simplicity, the high-ohmic state at 0 volts will be assumed in this illustration. However, in practice the diode is not very reliably blocked in this case. Therefore, −30 V is applied for the secure blocking state.

If a negative bias voltage (also zero for simplicity) is applied at the change-over switch 51 (switch for the different operating states, T/R-switch) for the PIN-diode bias voltage and the switch is at the positions S1-S5, the antenna 100 is connected to the preamplifier of the receiver 60. In this case, the respective PIN-diodes which are located in the current path are opened. In addition to the further separating capacitor 42.2, further elements, such as a phase-shifter, can be provided in the reception path. However, if an inverse voltage (e.g. +5 V) is applied as the bias voltage at the change-over switch 51, then one of the presettings S1 to S5 of the change-over switch 51 will become effective. In the switch position S1, the transmitter is connected to the antenna (classic transmission scenario).

In the switch positions S2 to S5, the coupling between an antenna 10, which is connected to the HF-transmitter and has a conductor loop arrangement 20, to other antennas 10 having a conductor loop arrangement 20, or inside an antenna 10 to the conductor loop arrangement 20 is utilized and the strength thereof is influenced. As a consequence, the amplitude of the generated magnetic field is influenced in such a manner that the desired entire field, e.g. corresponding to predetermined specifications, can be formed. In the switch position S2, a varactor-diode 43 is switched on, by means of which, with suitable dimensioning, the tuning state of the antenna 100 or of the conductor loop arrangement 20 can be remotely controlled. In the switch position S3, the variable capacitor likewise effects a change in the tuning state without any remote-control. In the switch position S4, an inductance is connected in parallel with the tuning capacitor. Therefore, the inductance together with the capacitor 24 (see FIG. 16) of the strip line resonator 10 or of a corresponding capacitor of a conductor loop arrangement can form a parallel oscillating circuit, so that the strip line resonator 10 or a conductor loop arrangement opens. In the switch position S5, the parallel capacitor of the strip line resonator 10 or a corresponding capacitor of the conductor loop arrangement is short-circuited in relation to HF. In all of the switch positions S2 to S5, the preamplifier of the receiver 60 is separated from the switching device 40, as the preamplifier is short-circuited at the input via a further PIN-diode 44 and the λ/4-cable is high-ohmic at the other end. In an advantageous manner, the change-over switch 51 can be designed in a manner known per se as an electronic switch, so that the entire switching device 40 can be remotely controlled.

Figure 16:
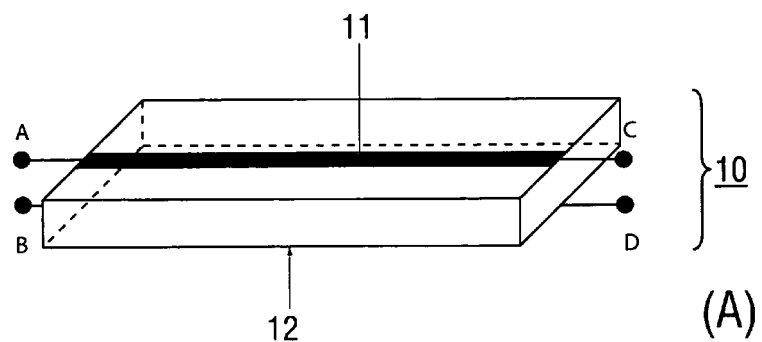
Figure 16:
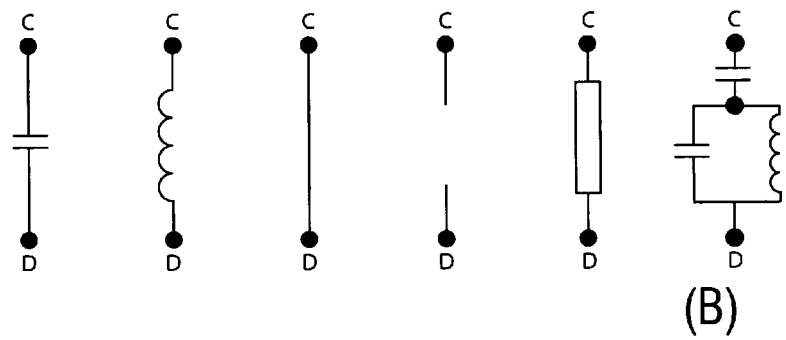
Figure 16:
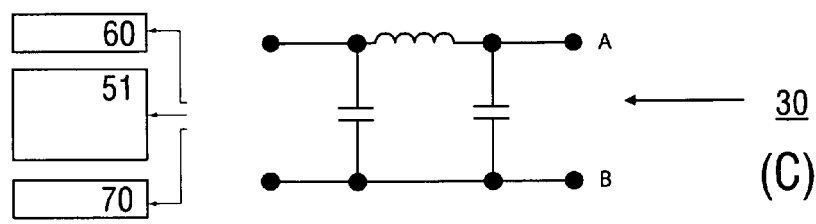
Figure 16:
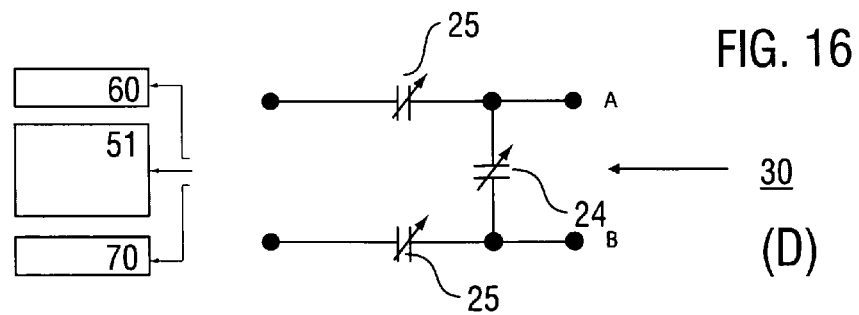
Figure 17:
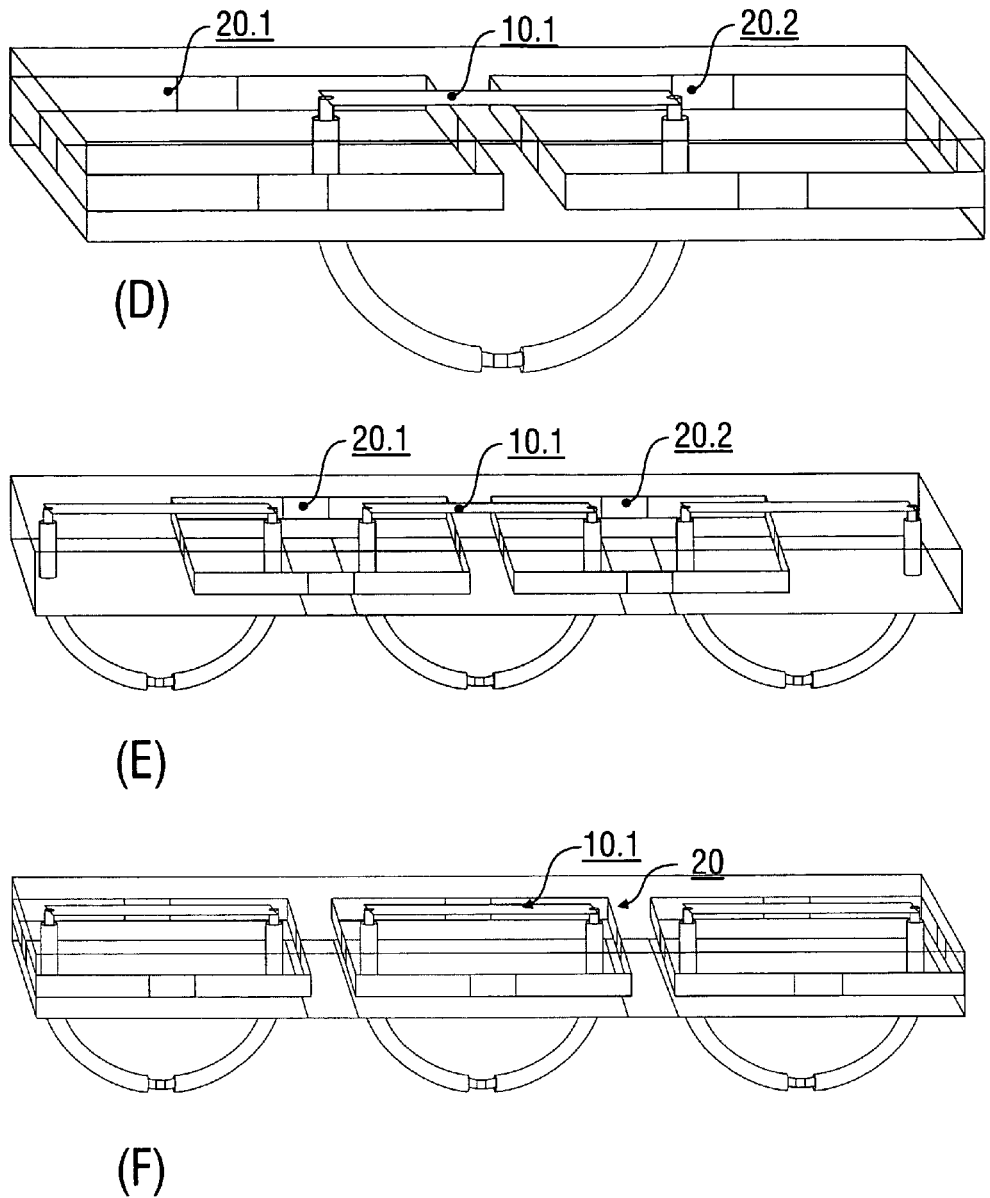

FIG. 16 schematically illustrates different variations of the control and termination of the strip line resonator 10 with the first and second conductor strips 11, 12. FIG. 16B illustrates different termination variations which can be provided at the connections C/D (see also FIG. 1A). The termination options include in particular a capacitive termination, an inductive termination, a short-circuit, an open termination, a termination with a resistance which is not equal to the wave resistance of the strip line resonator 10, and a termination with an oscillating circuit (tank circuit) in series with a series capacitor.

FIGS. 16C and 16D illustrate two possible ways of supplying the HF-voltage via the tuning device 30 to the connections NB (corresponding to the connections 26, see FIG. 1). As shown in FIG. 16C, impedance matching is provided with a so-called π-circuit (Collins-filter), whereas FIG. 16D illustrates the network of parallel and series capacitors 24, 25 for tuning and matching the strip line resonator 10.

FIG. 17 illustrates a two-dimensional array 200 which can be constructed from antennas 100 in accordance with the invention, in particular in accordance with at least one of the above-described embodiments. It should be expressly noted that it can be favorable for certain examinations to employ variable antennas 100 of different embodiments in an alternating fashion or in a predetermined sequence. In FIG. 17, the antennas 100 are aligned in the direction of a cylinder axis (z-direction) which corresponds e.g. with the direction of the static magnetic field $B_0$ of the MR-device. It can be advantageous for the antennas 100 or even only the strip line resonators to be disposed on a cylinder outer surface or an otherwise formed, anatomically adapted molded body at a certain angle with respect to the direction of the static magnetic field (e.g. along a helix). In this case, additional structuring of the transmission/reception profile is achieved in the direction of the static magnetic field.

It is also possible to tune individual segments of the variable antenna in accordance with the invention by means of known techniques to different Larmor frequencies and optionally to configure the tuning state to be switchable by means rapid switching diodes. However, for tuning the resonators it is also feasible to use networks which consist e.g. of a parallel oscillating circuit (tank) and a series-connected capacitor, and to facilitate simultaneous tuning to several Larmor frequencies. Where appropriate, the variable antennas described in accordance with the invention can also be operated in quadrature. In accordance with the invention, it is also possible to dispose one or several variable antennas in an anatomically adapted form, e.g. domed for head examinations or on the outer surface of a cylinder for examining extremities or in the form of two more or less planar surfaces for examinations conducted in the trunk region of the body.

The strip line resonators, which as such are known from the Prior art, are used in the case of the above-described embodiments of the invention. The inventors have recognized that in the case of the conventional strip line resonators it can be disadvantageous that a geometric minimum length must be provided in the z-direction (i.e. in the direction of the external magnetic field used for the magnetic resonance), as will be illustrated hereinafter by the example of a line terminated with a short-circuit.

In the case of a wavelength λ, the input impedance of the line of length l is:

$$Z_e = j \cdot Z_L \cdot \tan\frac{2\pi l}{\lambda},$$

where j defines the complex unit and $Z_L$ defines the line wave resistance. In the case of a length $l<\lambda/4$ the input resistance is inductive. In the case of $l=\lambda/4$ the input resistance becomes very large and a behavior analogous to a parallel oscillating circuit is observed. In the case of a length $l<\lambda/4$ it is likewise possible to achieve the behavior of a parallel oscillating circuit by means of an additional, parallel capacitor of suitable size at the input. The quality of an oscillating circuit is defined as:

$$Q = \frac{\text{Reactance}}{\text{Effective resistance}} = \frac{Z_L \cdot \tan(2\pi l/\lambda)}{A \cdot l/\kappa},$$

where A defines the conductor cross-sectional surface and K defines the (specific) conductivity. Since the reactance decreases from $l=\lambda/4$ to $l=\lambda/8$ more rapidly than the effective resistance, the quality falls sharply in this range, which restricts the use of strip line resonators approximately to the range $l \geq \lambda/8$.

Furthermore, the sensitivity of the antenna varies only to a relatively small extent in the z-direction (depending upon the termination proportional to $\sin \alpha$ or $\cos \alpha$) which ensures that the antenna receives noise over its entire length, although the wanted signal often only comes from a spatially limited region.

In order to be able to restrict the sensitivity of the antenna where possible to a specific target region which can vary from examination to examination or even within one examination, it would be desirable to dispose several strip line resonators one behind the other in the z-direction. However, owing to the minimum length and the possible coupling in the region of the connection and termination points between the strip line resonators, it is technically very complex to dispose several strip line resonators in the z-direction.

Therefore, in accordance with the invention a modified structure of the strip line resonator is proposed for the antenna in accordance with the invention, wherein the modified structure is characterized by a reduced extension, in particular a shortening of the strip line resonator. A preferred area of application for variable antennas of this type is e.g. surface-near regions such as the examination of the cortex of the brain or the skin of a biological organism, e.g. a human subject. However, an antenna which is constructed in accordance with this principle can also be advantageous for examining very small samples.

A first variation of the modified strip line resonator 10.1 is illustrated in FIGS. 17A-17F. In accordance with the invention, the strip line resonator 10.1 comprises at least one strip line 11.1 which in an advantageous manner is significantly shorter in comparison with conventional strip line resonators, and waveguides 14 (e.g. coaxial conductors 14.1), as known per se from waveguide technology. This resonator is also defined hereinafter as a "hybrid resonator". The above-described control of the variable antenna, e.g. with a tune and match unit etc., is connected preferably to the end of the waveguide extension, as illustrated by way of example in FIG. 17A.

The hybrid resonator comprises at least one strip line ($\lambda/2 \geq l \geq 0.01$ cm), whose desired electrical length is adjusted with the waveguides 14, resulting in an arrangement with a quality of Q>1 (FIG. 17A, without a conductor loop). A short, approximately 5 cm-long and 1 cm-wide strip line 11.1 is disposed on a suitable dielectric (in the example of FIG. 17A approximately 6 cm-long, 5 cm-wide and 1.5 cm-thick). In the illustrated example, the strip line 11.1 is extended perpendicularly through the dielectric 13 by two coaxial conductors 14. Below the dielectric 13, a metallization layer 12.1 is applied in opposition to the strip line 11.1. The two ends of the coaxial conductors 14 which protrude through the metallization layer 12.1 are used for supplying the transmission signal or for tapping the reception signal. In this example, the extensions are brought together on a semi-circle to form a connection point.

The dielectric 13 for the production of the variable antenna does not necessarily have to be cuboidal (illustrated as an example in the Figures) but can also be adapted to the examination object (e.g. the anatomical shape of a biological object). Possible materials for the dielectric include e.g. polypropylene or PTFE or even other high-quality dielectrics (such as air or vacuum). Equally, there are numerous options available for producing the conductor tracks which can range from e.g. self-adhesive metal foils to the vapor-deposition or electroplating of metal layers.

Coaxial conductors are advantageous as waveguides, as the electrical field is shielded towards the outside and therefore couplings via the electrical field remain small. Alternatively, it is also possible to use wires or foils as the waveguide extension of the strip line. Furthermore, discrete components used for matching or tuning purposes can be disposed in or on these extensions.

The hybrid resonator can be used in a similar manner to a conventional strip line resonator, in order to produce the antenna in accordance with the invention. The hybrid resonator e.g. together with a conductor loop resonator 20 disposed optionally in series can form a variable antenna (FIG. 17B, FIG. 17F). By reason of their symmetry, the partial antennas which are produced in this manner are geometrically decoupled (>20 dB) and can be adapted within broad limits to the requirements in particular for parallel transmission and/or parallel reception. The conductor loop resonator 20 is produced by the methods described above.

Alternatively, the conductor loop resonator 20 can be formed in the conductor configuration as shown in FIG. 17C or in accordance with the variations depicted above (cf. e.g. FIG. 4, FIG. 5 and FIGS. 10 to 16). Therefore, as shown in FIG. 17C an arrangement consisting of two hybrid resonators 10.1, 10.2 and a conductor loop resonator 20 is provided. In this case, the geometric decoupling achieved is also very effective (>20 dB).

Furthermore, a variation having two conductor loop resonators 20.1, 20.2 and at least one hybrid resonator 10.1 can be readily accomplished (FIG. 17D, 17E). By reason of the symmetry, this variation is also decoupled in an effective manner in geometric terms (>20 dB). Alternatively, conductor loop resonators can be disposed so as to be geometrically overlapping, formed in the manner of a figure-of-8-coil or optionally also formed with a polygonal or elliptical cross-section.

In an advantageous manner, the field profiles of the antennas with the modified strip line resonator have progressions, as depicted above. The sensitivity profile of the strip line resonator decreases in the case of the hybrid resonator corresponding to the greatly reduced strip length in the longitudinal direction. In directions orthogonal thereto, the sensitivity profiles in the case of a similar construction are comparable for the strip line resonator and the hybrid resonator.

The decrease in the sensitivity profile in the case of the hybrid resonator in the z-direction in comparison with the strip line resonator permits a higher signal-to-noise ratio, higher acceleration in parallel acquisition techniques and higher-precision adaptation of the sensitivity profile to the examination object.

Figure 18:
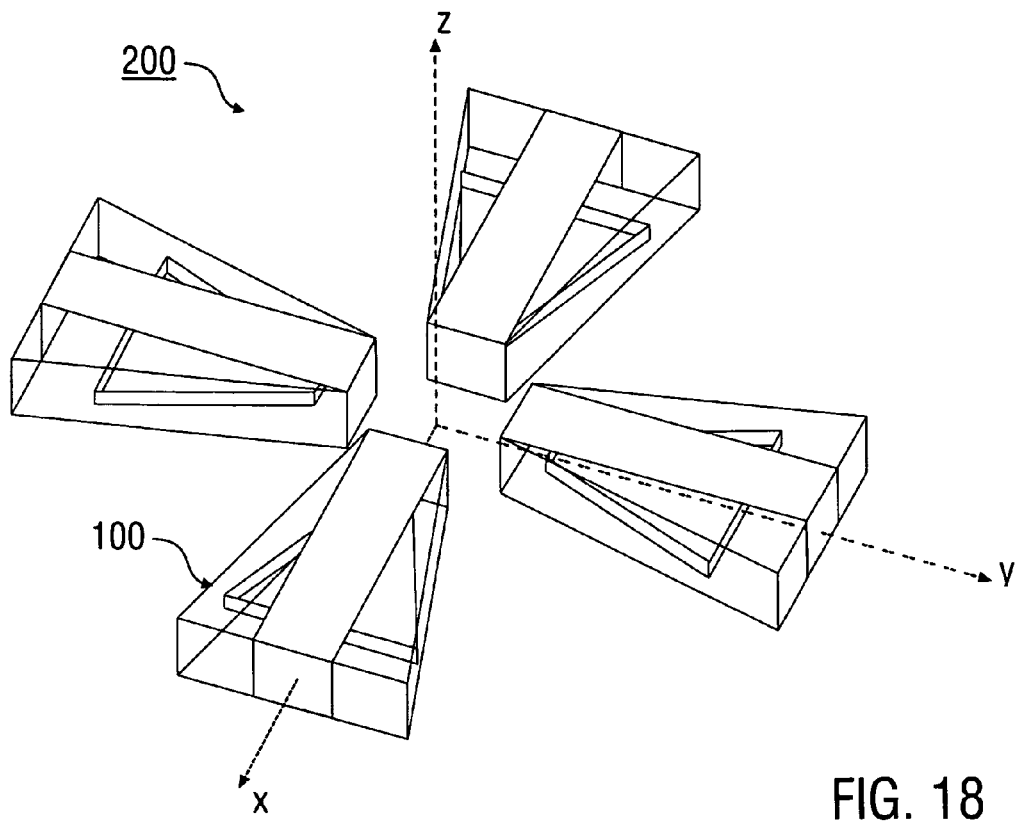

The illustrated variations with respect to the hybrid resonator can also be disposed on a curved insulating body (e.g. formed in the manner of a helmet or dome). Surprisingly, the effect of improved irradiation in the upper region of the examination object (e.g. a human head) can also be achieved without any curvature of the insulating body by virtue of the fact that in addition to the attachment to a cylinder outer surface variable antennas (e.g. consisting of conductor loop and hybrid resonators or of conductor loop and strip line resonators) can also be disposed on an end surface. This is illustrated schematically in FIG. 18. In this case, two opposite conductor loops are connected as a "figure-of-8-coil" and generate a high-frequency magnetic field $B_1$ in the radial direction, whereas the strip line resonators generate $B_1$-fields in the tangential direction. Therefore, a figure-of-8-coil and the associated strip line resonators each form a "quadrature pair" with optimum decoupling. FIG. 18 illustrates by way of example two such "quadrature pairs" which are rotated through 90°. Alternatively, it is also possible to accommodate further pairs of this type on the end surface of the cylinder, e.g. by changing the dimensions.

Figure 19:
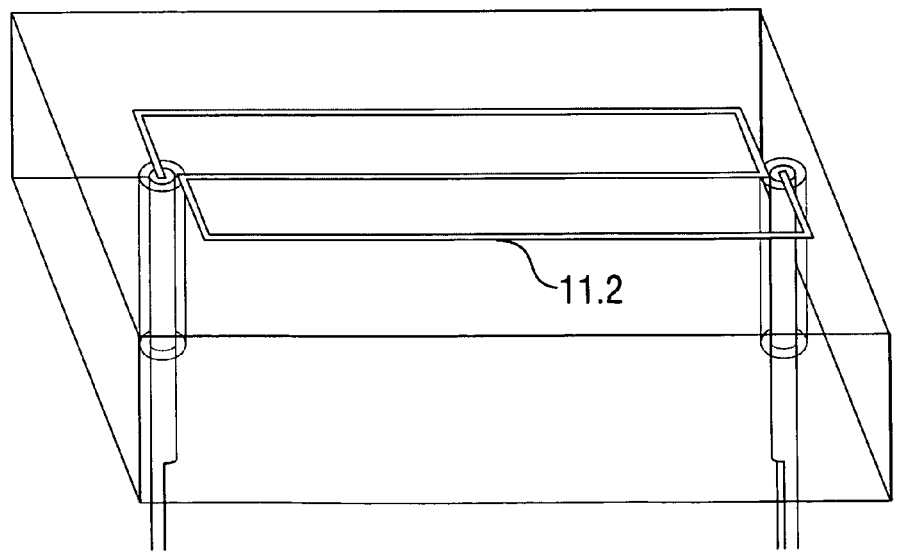
Figure 20:
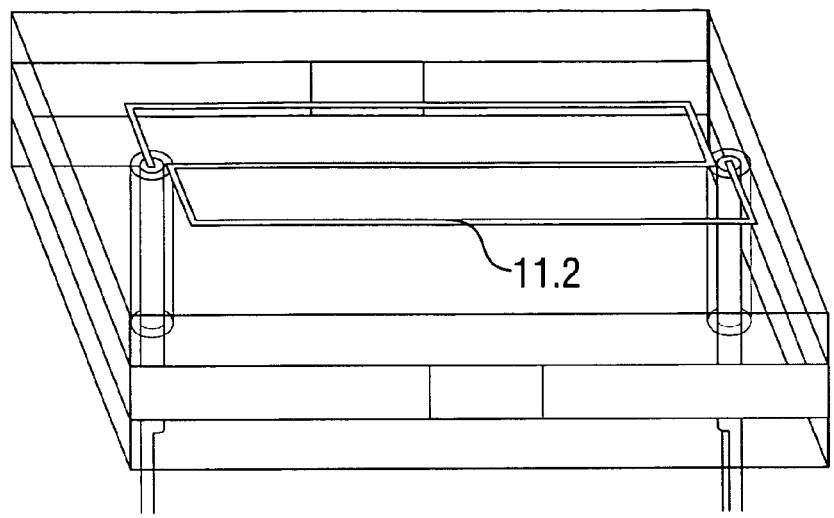
Figure 21:
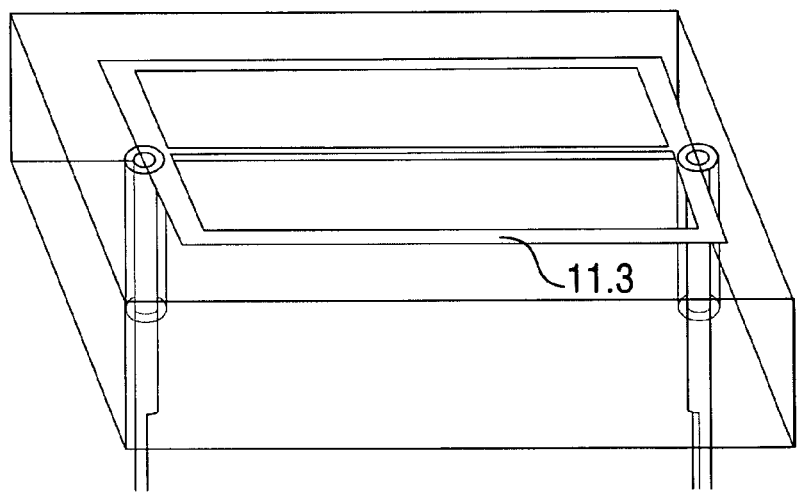

In addition to the geometric forms of the extension by means of circularly curved coaxial conductors as illustrated in FIG. 17, other arrangements are also possible, e.g. in rectangular, hairpin or meandering form. The inventors have also established that surprisingly the hybrid resonator can be reduced further in size to dimensions of micro-coils, in order to provide e.g. a variable (quadrature) antenna for very small examination objects. When the strip line resonator is reduced further in size in the longitudinal direction (e.g. less than 1 cm) the inductance is greatly reduced in the region of the strip line on the substrate. This can be counteracted by virtue of the fact that the strip line 11.2 is disposed in a meandering fashion (FIGS. 19, 20) on the substrate. If the spaced intervals between the individual strips are selected to be small in comparison with the length, a field progression similar to the compact strip line is essentially formed. By reason of the symmetry, very good values for the decoupling are also achieved. For this arrangement, a decoupling of better than 25 dB with respect to adjacent conductor loop resonators has been evaluated by simulation calculations, which represents very good values for most applications. Such finely structured, variable antennas can be produced e.g. by the methods known from micromechanics and microelectronics. FIG. 21 illustrates that it can be advantageous to produce the strip line from several individual conductors, e.g. in order to adjust the depth of penetration of the fields in the examination object.

Even in the case of the conductor loop resonator, a decrease in inductance and thus in quality is also observed when the dimensions of the antenna are reduced. This can be counteracted by virtue of the fact that the conductor loop resonator is also designed for very small examination objects e.g. "helical" (optionally also with a rectangular or other cross-section, or in a planar arrangement; not illustrated here).

The features of the invention disclosed in the above-description, the drawings and in the claims can be significant individually or also in combination for carrying out the invention in its various embodiments.

The invention claimed is:

1. An antenna for a magnetic resonance device which has a predetermined sensitivity and is arranged for at least one of generating and receiving alternating magnetic fields in the near field of the antenna for at least one of exciting and detecting a magnetic resonance in an object to be examined, comprising:

a strip line resonator which comprises at least one strip line constructed of a waveguide, wherein the strip line resonator extends along a planar reference surface and is resonantly tuned with an appropriate termination establishing a sensitivity profile of said strip line resonator, and a conductor loop arrangement which comprises a conductor, is disposed adjacent to the strip line resonator and forms at least one closed conductor loop establishing a sensitivity profile of said conductor loop arrangement, wherein the at least one closed conductor loop surrounds the strip line resonator in the planar reference surface and is interrupted by at least one capacitor, wherein the sensitivity of the antenna is formed by overlapped sensitivity profiles of the strip line resonator and the conductor loop arrangement, and wherein the at least one conductor loop is formed with a layered conductor.

2. The antenna as claimed in claim 1, wherein the at least one conductor loop is aligned in a non-parallel manner relative to the strip line.

3. The antenna as claimed in claim 1, wherein the at least one conductor loop is aligned orthogonally relative to the strip line.

4. The antenna as claimed in claim 1, wherein the at least one conductor loop comprises at least one ring or at least one polygon.

5. The antenna as claimed in claim 1, further comprising a tuning device which is arranged for tuning the antenna to at least one Larmor frequency.

6. The antenna as claimed in claim 5, wherein the tuning device is arranged for tuning various parts of the antenna to different Larmor frequencies.

7. The antenna as claimed in claim 6, wherein the tuning device is arranged such that specific parts of the antenna are tuned to several Larmor frequencies.

8. The antenna as claimed in claim 5, wherein the at least one capacitor is part of the tuning device.

9. The antenna as claimed in claim 1, further comprising a switching device adapted to vary the sensitivity of the antenna.

10. The antenna as claimed in claim 9, wherein the switching device comprises PIN-diodes.

11. The antenna as claimed in claim 1, wherein each of the strip line resonator and the antenna further comprises a control device, which comprises a change-over switch for connecting to a receiver and a transmitter of the magnetic resonance device.

12. The antenna as claimed in claim 1, which is formed exclusively as a transmitting antenna.

13. The antenna as claimed in claim 1, which is formed exclusively as a receiving antenna.

14. The antenna as claimed in claim 1, wherein: (a) the at least one strip line of the strip line resonator comprises an extension which comprises a waveguide, (b) the at least one strip line of the strip line resonator is formed as a short conductor strip having a length less than λ/8, (c) the at least one strip line of the strip line resonator is formed in a meandering fashion, and (d) the at least one strip line of the strip line resonator comprises several partial strips.

15. An antenna array which comprises a plurality of the antenna as claimed in claim 1.

16. The antenna array as claimed in claim 15, wherein each said antenna is disposed on a curved surface.

17. The antenna array as claimed in claim 16, wherein the antennas are disposed on the curved surface in a helical manner.

18. A magnetic resonance device which comprises: (a) at least one antenna as claimed in claim 1, or (b) an antenna array comprising a plurality of the antenna as claimed in claim 1.

19. The magnetic resonance device as claimed in claim 18, wherein the at least one antenna is disposed in such a manner that the sensitivity of the antenna is at its maximum perpendicular to a static magnetic field of the magnetic resonance device.

20. The magnetic resonance device as claimed in claim 18, wherein the at least one antenna is disposed in such a manner that a direction of maximum sensitivity of the antenna is inclined relative to a static magnetic field of the magnetic resonance device.

21. The magnetic resonance device as claimed in claim 18, further comprising a receiver and a transmitter, wherein the strip line resonator and the conductor loop arrangement of the antenna are connected to the receiver and the transmitter via change-over switches.

22. A method for magnetic resonance imaging or magnetic resonance spectroscopy, including steps of at least one of exciting and detecting a magnetic resonance in an object, which is to be examined, with an antenna as claimed in claim 1 or an antenna array comprising a plurality of the antenna of claim 1.

23. The method as claimed in claim 22, wherein the antenna is used as a transmitting antenna, receiving antenna or as a transmitting-receiving antenna or in alternating operation or for a transmission-side or reception side parallel imaging technique or a combination of both methods.

24. An antenna for a magnetic resonance device which has a predetermined sensitivity and is arranged for at least one of exciting and detecting a magnetic resonance in an object to be examined, comprising:

a strip line resonator which comprises at least one strip line, wherein the strip line resonator extends along a planar reference surface, and a conductor loop arrangement which comprises a conductor, is disposed adjacent to the strip line resonator and forms at least one closed conductor loop, wherein the at least one closed conductor loop surrounds the strip line resonator in the planar reference surface and is interrupted by at least one capacitor, wherein the sensitivity of the antenna is formed by overlapped sensitivity profiles of the strip line resonator and the conductor loop arrangement, and wherein the at least one conductor loop is formed with a layered conductor wherein the at least one conductor loop comprises at least one ring or at least one polygon and wherein: (a) at least one of the at least one ring or at least one of the at least one polygon overlap one another or are disposed at a mutual spaced interval, and (b) at least one of the at least one ring or at least one of the at least one polygon comprise a loop form having at least two holes.

25. An antenna for a magnetic resonance device which has a predetermined sensitivity and is arranged for at least one of exciting and detecting a magnetic resonance in an object to be examined, comprising:

a strip line resonator which comprises at least one strip line, wherein the strip line resonator extends along a planar reference surface, and a conductor loop arrangement which comprises a conductor, is disposed adjacent to the strip line resonator and forms at least one closed conductor loop, wherein the at least one closed conductor loop surrounds the strip line resonator in the planar reference surface and is interrupted by at least one capacitor, wherein the sensitivity of the antenna is formed by overlapped sensitivity profiles of the strip line resonator and the conductor loop arrangement, and wherein the at least one conductor loop is formed with a layered conductor, the antenna comprising several conductor loops, wherein: (a) a first one of the conductor loops comprises a loop form having at least two holes, (b) a second one of the conductor loops comprises a ring or a polygon, and (c) several conductor loops are provided which are disposed one above another.

* * * * *